(12) United States Patent
Yang

(10) Patent No.: US 7,184,195 B2
(45) Date of Patent: Feb. 27, 2007

(54) METHOD AND STRUCTURE REDUCING PARASITIC INFLUENCES OF DEFLECTION DEVICES IN AN INTEGRATED SPATIAL LIGHT MODULATOR

(75) Inventor: Xiao Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 0 days.

(21) Appl. No.: 11/154,834

(22) Filed: Jun. 15, 2005

(65) Prior Publication Data

US 2006/0285191 A1 Dec. 21, 2006

(51) Int. Cl.
G02B 26/08 (2006.01)
G02B 26/00 (2006.01)

(52) U.S. Cl. .................. 359/295; 359/223; 359/224; 359/291; 359/298

(58) Field of Classification Search ............... 257/414; 359/223, 224, 291, 292, 295, 298
See application file for complete search history.

(56) References Cited

U.S. PATENT DOCUMENTS

| 4,229,732 | A | | 10/1980 | Hartstein et al. |
| 4,317,611 | A | | 3/1982 | Petersen |
| 4,566,935 | A | | 1/1986 | Hornbeck |
| 4,615,595 | A | | 10/1986 | Hornbeck |
| 5,061,049 | A | | 10/1991 | Hornbeck |
| 5,172,262 | A | | 12/1992 | Hornbeck |
| 5,311,360 | A | | 5/1994 | Bloom et al. |
| 5,382,961 | A | | 1/1995 | Gale, Jr. |
| 5,447,600 | A | * | 9/1995 | Webb .................. 216/2 |
| 5,448,314 | A | | 9/1995 | Heimbuch et al. |
| 5,452,024 | A | | 9/1995 | Sampsell |
| 5,489,952 | A | | 2/1996 | Gove et al. |
| 5,504,614 | A | | 4/1996 | Webb et al. |

(Continued)

FOREIGN PATENT DOCUMENTS

EP 1237032 A2 9/2002

OTHER PUBLICATIONS

Henley et al., "A New SOI Manufacturing Technology Using Atomic layer Cleaving." Silicon Genesis Corporation Campbell CA. pp. 1-5.

(Continued)

Primary Examiner—George Fourson
Assistant Examiner—Victor A. Mandala, Jr.
(74) Attorney, Agent, or Firm—Townsend and Townsend and Crew LLP

(57) ABSTRACT

A method of fabricating an integrated spatial light modulator with contact structures. The method includes providing a first substrate having a bonding surface, providing a device substrate having a device surface, and depositing a first layer on the device surface, the first layer having an upper surface opposite the device surface. The method also includes patterning the first layer to define a plurality of contact structure openings, depositing a conductive layer on the upper surface of the first layer, reducing the thickness of the conductive layer, and removing at least a portion of the first layer to expose a plurality of contact structures. The method further includes depositing a standoff layer on the first layer, forming standoff structures from the standoff layer, and joining the bonding surface of the first substrate to the standoff structures to form a bonded substrate structure.

13 Claims, 11 Drawing Sheets

U.S. PATENT DOCUMENTS

| | | | |
|---|---|---|---|
| 5,535,047 A | 7/1996 | Hornbeck | |
| 5,583,688 A | 12/1996 | Hornbeck | |
| 5,589,852 A | 12/1996 | Thompson et al. | |
| 5,600,383 A * | 2/1997 | Hornbeck | 348/771 |
| 5,661,591 A | 8/1997 | Lin et al. | |
| 5,663,749 A | 9/1997 | Farris et al. | |
| 5,742,419 A | 4/1998 | Dickensheets et al. | |
| 5,757,536 A | 5/1998 | Rioco et al. | |
| 5,793,519 A | 8/1998 | Furlani et al. | |
| 5,835,256 A | 11/1998 | Huibers | |
| 5,885,468 A | 3/1999 | Kozlowski | |
| 5,939,171 A | 8/1999 | Biebl | |
| 5,999,306 A | 12/1999 | Atobe et al. | |
| 6,038,056 A | 3/2000 | Florence et al. | |
| 6,046,840 A | 4/2000 | Huibers | |
| 6,049,317 A | 4/2000 | Thompson et al. | |
| 6,127,756 A | 10/2000 | Iwaki et al. | |
| 6,172,797 B1 | 1/2001 | Huibers | |
| 6,201,521 B1 | 3/2001 | Doherty | |
| 6,252,277 B1 | 6/2001 | Chan et al. | |
| 6,285,490 B1 | 9/2001 | Meier et al. | |
| 6,323,982 B1 | 11/2001 | Hornbeck | |
| 6,337,760 B1 | 1/2002 | Huibers et al. | |
| 6,356,378 B1 | 3/2002 | Huibers | |
| 6,388,661 B1 | 5/2002 | Richards | |
| 6,396,619 B1 | 5/2002 | Huibers et al. | |
| 6,429,033 B1 | 8/2002 | Gee et al. | |
| 6,487,001 B2 * | 11/2002 | Greywall | 359/292 |
| 6,522,454 B2 * | 2/2003 | Meier et al. | 359/291 |
| 6,529,310 B1 | 3/2003 | Huibers et al. | |
| 6,538,800 B2 | 3/2003 | Huibers | |
| 6,542,653 B2 | 4/2003 | Wu et al. | |
| 6,543,286 B2 | 4/2003 | Garverick et al. | |
| 6,590,695 B1 * | 7/2003 | Kurtz et al. | 359/291 |
| 6,618,186 B2 * | 9/2003 | Kaeriyama | 359/292 |
| 6,760,143 B2 * | 7/2004 | Yoon | 359/290 |
| 6,809,852 B2 | 10/2004 | Tao et al. | |
| 6,813,054 B2 * | 11/2004 | Aksyuk et al. | 359/224 |
| 6,820,988 B2 | 11/2004 | van Drieenhuizen | |
| 6,827,866 B1 | 12/2004 | Novotny | |
| 6,856,068 B2 | 2/2005 | Miller et al. | |
| 6,872,447 B1 * | 3/2005 | Endo et al. | 428/343 |
| 6,891,654 B2 | 5/2005 | Kurosawa et al. | |
| 6,891,655 B2 | 5/2005 | Grebinski et al. | |
| 2002/0041455 A1 | 4/2002 | Sawada et al. | |
| 2002/0071166 A1 | 6/2002 | Jin et al. | |
| 2002/0071169 A1 | 6/2002 | Bowers et al. | |
| 2002/0132389 A1 | 9/2002 | Patel et al. | |
| 2003/0117686 A1 | 6/2003 | DiCarlo | |
| 2003/0207487 A1 | 11/2003 | Kubena et al. | |
| 2004/0000696 A1 | 1/2004 | Ma et al. | |
| 2004/0004753 A1 | 1/2004 | Pan | |
| 2004/0008402 A1 | 1/2004 | Patel et al. | |
| 2004/0125347 A1 | 7/2004 | Patel et al. | |
| 2004/0136044 A1 | 7/2004 | Miller et al. | |
| 2004/0184133 A1 | 9/2004 | Su et al. | |
| 2004/0190817 A1 | 9/2004 | Aubuchon | |
| 2005/0041277 A1 | 2/2005 | Huibers | |

OTHER PUBLICATIONS

Petersen, K.E., Micromechanical Light Modulator Array Fabricated On Silicon. Applied Physics Letters. Oct. 15, 1977, pp. 521-523, vol. 31 No. 8.

Petersen, K.E., Micromechanical Membrane Switches On Silicon. IBM J. Res. Develop., Jul. 1979, pp. 376-385. vol. 23, No. 4.

* cited by examiner

METHOD AND STRUCTURE REDUCING PARASITIC INFLUENCES OF DEFLECTION DEVICES IN AN INTEGRATED SPATIAL LIGHT MODULATOR

BACKGROUND OF THE INVENTION

The present invention relates generally to semiconductor processing techniques. More particularly, the invention includes a method and structure for forming an integrated spatial light modulator. Merely by way of example, the invention has been applied to a method of forming standoff structures in a bonded substrate structure and micro-electromechanical systems with reduced parasitic forces. The method and structure can be applied to other applications as well, such as actuators, sensors, detectors, and display components.

Spatial light modulators (SLMs) have numerous applications in the areas of optical information processing, projection displays, video and graphics monitors, and televisions. Reflective SLMs are devices that modulate incident light in a spatial pattern to reflect an image corresponding to an electrical or optical input. The incident light may be modulated in phase, intensity, polarization, or deflection direction. A reflective SLM is typically comprised of a one or two-dimensional array of addressable picture elements (pixels) capable of reflecting incident light. Source pixel data is first processes by an associated control circuit, then loaded into the pixel array, one frame at a time.

The fabrication processes used to manufacture SLMs are varied. In some of the fabrication processes, multiple substrates are bonded together to form the SLM structure. Some of these fabrication processes require alignment of the substrates prior to bonding, with tolerances on the order of microns, which may be a time consuming and expensive process.

In some SLM structures, micro-electromechanical systems (MEMS) are used to form micro-mirror arrays, sensors, and actuators. In some of these applications, a suspended member is attracted to an electrode upon application of an electrical force and restored to an original position by a restoring force. As the suspended member approaches the electrode, surface forces can exert influences on the MEMS. These surface forces are sometimes referred to as "stiction" forces, since in some MEMS, parasitic forces arise from a combination of MEMS components sticking together and from friction, thus the term stiction. These parasitic forces may be strong enough to overcome the restoring force, resulting in an undesirable adhesion of the suspended member to the electrode.

As merely an example, conventional MEMS have relied upon a variety of techniques to overcome such stiction forces. For example, certain devices have relied upon the coating of MEMS components and the use of complex mechanical structures. Unfortunately, these techniques also have limitations. For example, some coatings are difficult to deposit on small components and can require complex deposition equipment. Moreover, complex mechanical structures may have reliability and lifetime concerns.

Therefore there is a need in the art for improved methods and structures for fabrication processes for integrated SLMs and for methods and apparatus to reduce parasitic forces in electro-mechanical systems.

SUMMARY OF THE INVENTION

According to the present invention, techniques for semiconductor processing are provided. More particularly, the invention relates to a method and structure for forming an integrated spatial light modulator. Merely by way of example, the invention has been applied to a method of forming standoff structures in a bonded substrate structure and micro-electromechanical systems with reduced parasitic forces. The method and structure can be applied to other applications as well, such as actuators, sensors, detectors, and display components.

According to an embodiment of the present invention, a method of fabricating an integrated spatial light modulator with contact structures is provided. The method includes providing a first substrate having a bonding surface, providing a device substrate having a device surface, and depositing a first layer on the device surface, the first layer having an upper surface opposite the device surface. The method also includes patterning the first layer to define a plurality of contact structure openings passing through the first layer from the upper surface to the first substrate, depositing a conductive layer on the upper surface of the first layer, and reducing the thickness of the conductive layer. The method further includes removing at least a portion of the first layer to expose a plurality of contact structures, depositing a standoff layer on the first layer, the standoff layer having an upper surface opposite the first layer, forming standoff structures from the standoff layer, and joining the bonding surface of the first substrate to the standoff structures to form a bonded substrate structure.

According to another embodiment of the present invention, a spatial light modulator is provided. The spatial light modulator includes a first substrate, the first substrate comprising a plurality of electrodes adapted to receive control signals, a bias grid coupled to the first substrate and electrically isolated from the plurality of electrodes, and a standoff structure coupled to the first substrate. The spatial light modulator further includes a mirror plate bonded to the standoff structure, electrically coupled to the bias grid, and adapted to rotate from a first orientation to a second orientation in response to the control signals received by the plurality of electrodes. The spatial light modulator also includes a landing post support structure coupled to the first substrate and electrically coupled to the bias grid and a landing post coupled to the landing post support structure, electrically coupled to the bias grid, and adapted to make contact with the mirror plate positioned at the first orientation.

According to an alternative embodiment, an array of integrated spatial light modulators is provided. The array of integrated spatial light modulators includes an electrode layer coupled to a device substrate, the electrode layer including a plurality of electrodes and at least one alignment mark, a bias grid layer coupled to the device substrate and electrically isolated from the electrode layer, and a plurality of landing posts coupled to the device substrate and electrically coupled to the bias grid layer. The array of integrated spatial light modulators also includes a three-dimensional standoff structure, the standoff structures having side regions defined in a plane perpendicular to the device substrate, a bottom region coupled to the device substrate, and a top region opposite the bottom region. The array of integrated spatial light modulators further includes a silicon layer coupled to the top region of the standoff structure, the silicon layer comprising a hinge support region coupled to the top region of the standoff structure, a plurality of hinges coupled to the hinge support region, and a plurality of moveable members aligned with respect to the at least one alignment mark by imaging the at least one alignment mark through the silicon layer.

Numerous benefits are achieved using the present invention over conventional techniques. For example, in an embodiment according to the present invention, the alignment tolerances used during the substrate bonding process are greatly relaxed. Moreover, the dimensions of the composite substrate used in one embodiment are reduced, decreasing cost and improving layer uniformity. This increased layer uniformity extends, for example, to the thickness of a micro-mirror layer present in the composite substrate. Additionally, standoffs fabricated according to embodiments of the present invention provide a bonding surface with decrease surface roughness, leading to an increase in bond strength.

Moreover, embodiments of the present invention provides a means to simplify fabrication of spatial light modulator components. Additionally, the present invention provides a flexible design that can be optimized to meet the needs of particular applications. For example, the size and position of landing posts may be modified depending on the design constraints presented by a given application. In addition, the flexibility of design extends to materials optimized for particular applications. In embodiments according to the present invention, complex coatings are not necessary to reduce parasitic forces present in the MEMS. In certain embodiments, the invention also provides a way of operating a MEMS device to overcome stiction forces. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

According to the present invention, techniques for semiconductor processing are provided. More particularly, the invention relates to a method and structure for forming an integrated spatial light modulator. Merely by way of example, the invention has been applied to a method of forming standoff structures in a bonded substrate structure and micro-electromechanical systems with reduced parasitic forces. The method and structure can be applied to other applications as well, such as actuators, sensors, detectors, and display components.

Figure 1A:
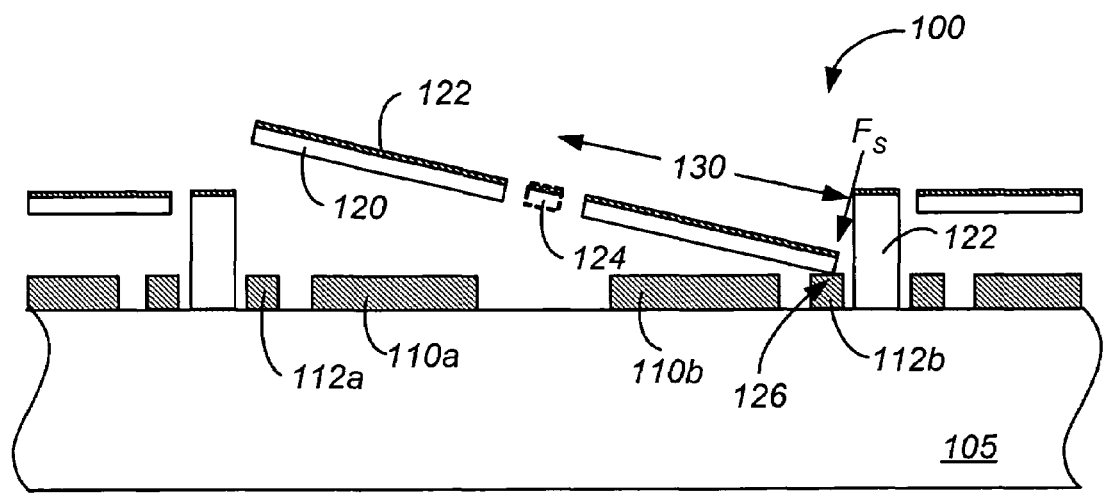
FIG. 1A is a simplified cross-sectional illustration of a conventional spatial light modulator.

FIG. 1A is a simplified cross-sectional illustration of a conventional spatial light modulator. Suspended member 120 is suspended at a predetermined height above a substrate 105. Suspended member 120 has a reflective surface 122 coupled to the member. In addition, a torsion spring 124 is coupled to both the suspended member and a support structure (not shown) on substrate 105. In the figure, an electric potential has been applied between electrodes 110 and the suspended member, resulting in tilting of the suspended member in a clockwise direction and placing the suspended member in an activated state. As illustrated, the right side of member 120 has been brought into contact at point 126 with contact pad 112*b* coupled to the substrate 105. In this activated state, torsion spring 124 exerts a counter-clockwise torque on the suspended member. The suspended members adjacent to member 120 are illustrated in a horizontal position, for example, in an unactivated state. In some applications, a bias of approximately 60 V is applied to both the suspended member and the contact pad 112*b* to place the suspended member and the contact pad at the same potential prior to and during contact between these structures.

Parasitic forces or stiction forces, represented by the vector $F_S$, present in the vicinity of point 126 will attract the suspended member toward the substrate, opposing forces attempting to return the suspended member to a horizontal state. If the suspended member becomes pinned in the position illustrated in the figure, it will not be able to transition between the horizontal and activated states, resulting in an undesirable condition.

In many MEMS applications, parasitic forces may exert an impact on system design and performance. The magnitude of the parasitic forces observed in a MEMS depends on a variety of factors. For example, if two portions of a MEMS are in contact with each other, a parasitic force dependent on the contact area may be present. In addition, the material used in the fabrication of the MEMS may impact the magnitude of the parasitic force. In some cases, the material dependence of the force is related to Van der Waals forces. As an additional example of the factors that can impact the magnitude of parasitic forces, an increase in the humidity of the MEMS environment typically increases the magnitude of the parasitic forces.

Figure 1B:
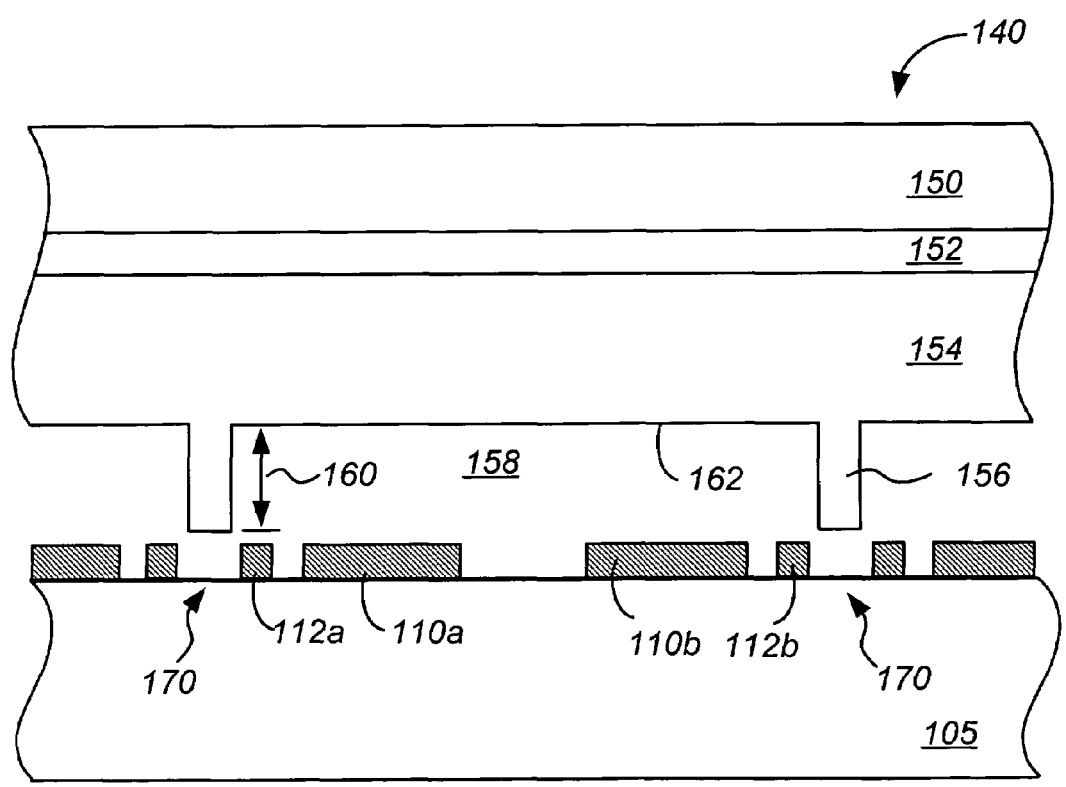
FIG. 1B is a simplified schematic side view illustration of a conventional SOI substrate and an electrode substrate prior to wafer bonding.

FIG. 1B is a simplified schematic side view illustration of a conventional silicon on insulator (SOI) substrate structure and an electrode substrate prior to wafer bonding. In some applications, SOI substrate 140 is processed to include a plurality of deflection devices (not shown) formed from layer 154. The deflection devices can be mirror structures, such as movable mirrors. Such mirror structures can be used for display devices, such as an array of micro-mirrors forming a spatial light modulator or the like. As illustrated in the figure, layer 150 is silicon, layer 152 is a buried oxide, and layer 154 is single crystal silicon. Other like substrate materials, for example, polysilicon or amorphous silicon are used to form layers 150 through 154 in other embodiments.

Layer 154 of the SOI substrate is processed using semiconductor processing techniques to form support members 156, which extend from the surface of the layer 154. Masking and etching processes well known to those of skill in the art are utilized to form support members 156. In a typical process, the depth 160 of the etch step defines the height of the support members while the lateral dimensions of the masking layer define the two-dimensional profile of the support members. The surface morphology at surface 162 is a function of the etch process and is typically selected to provide a smooth surface with a uniform etch depth. Although the support members 156 are illustrated in only one dimension in the figure, they typically form two-dimensional structures, defining recessed regions 158 surrounded by support members 156. Support members fabricated from a layer of single crystal silicon provide a degree of mechanical rigidity to the composite structure and are processed using well developed semiconductor processing techniques.

The electrode substrate 105 can be an integrated circuit device having a plurality of electrode devices 110, as shown. The integrated circuit device can include drive devices (not shown) coupled to each of the electrodes. In one application, the drive devices include CMOS circuitry fabricated in processing steps (not shown) prior to the formation of the plurality of electrode devices 110. The drive devices can be used to apply voltages to the electrodes to actuate selected mirror devices present on the SOI substrate structure. Preferably, the electrode substrate structure is made using a silicon wafer or other like substrate material. Further details of both the SOI and electrode substrate structures can be found in U.S. patent application Ser. No. 10/756,936, filed Jan. 13, 2004, commonly owned, and hereby incorporated by reference for all purposes.

In some applications, substrates 140 and 105 are joined to form a composite substrate structure. Wafer bonding techniques are utilized to join the substrates and form a mechanical bond. Support members 156 extending from the lower surface of substrate 140 are bonded to the upper surface of the electrode substrate at locations 170. For example, support members fabricated from silicon may form a hermetic seal when bonded to silicon areas present on the upper surface of a silicon electrode substrate. Recessed regions 158 will form cavities above the electrodes 110 after the bonding process. After bonding, substrate 140 is thinned using chemical mechanical polishing (CMP), grinding, etchback, any combination of these, and the like. In one application, the buried oxide layer 152 provides an etch stop layer during the thinning process. After exposure of layer 154, mirror structures are patterned and fabricated in layer 154 as described above.

As illustrated in FIG. 1B, the two substrates are aligned prior to wafer bonding. The alignment of the support members to the electrodes is controlled to assure the correct spatial relationship between the mirrors formed above regions 158 and the electrodes 110. Moreover, the alignment of the support members 156 to the bonding areas 170 on the electrode substrate is controlled to ensure the support members make the desired contact with the silicon material of the electrode substrate and not, for example, an electrode. Wafer alignment techniques have been developed, but sometimes involve additional processing steps, increasing processing costs and decreasing throughput.

Figure 2A:
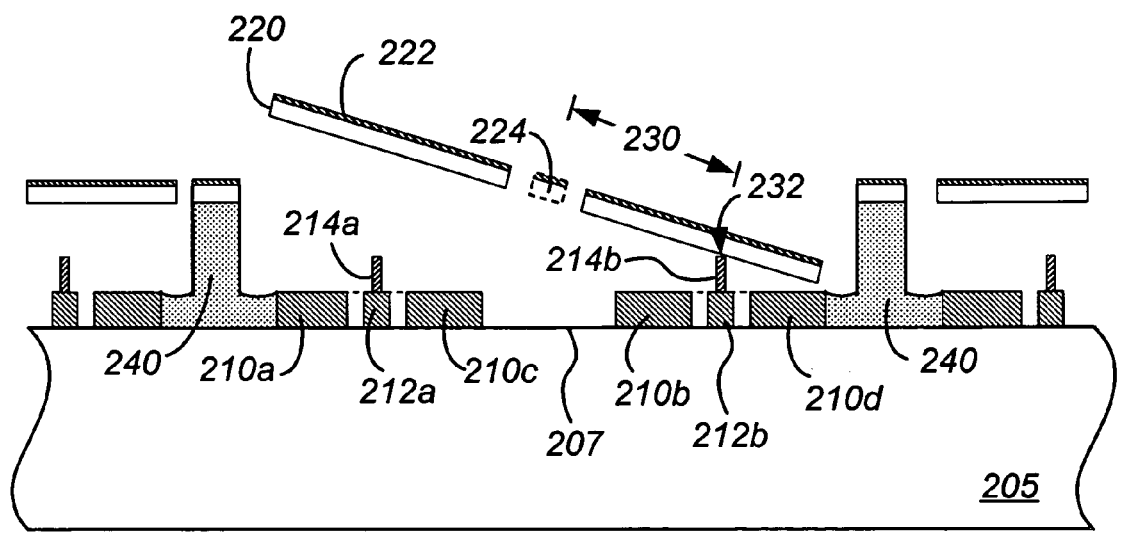
FIG. 2A is a simplified cross-sectional illustration of a spatial light modulator according to an embodiment of the present invention.
Figure 2B:
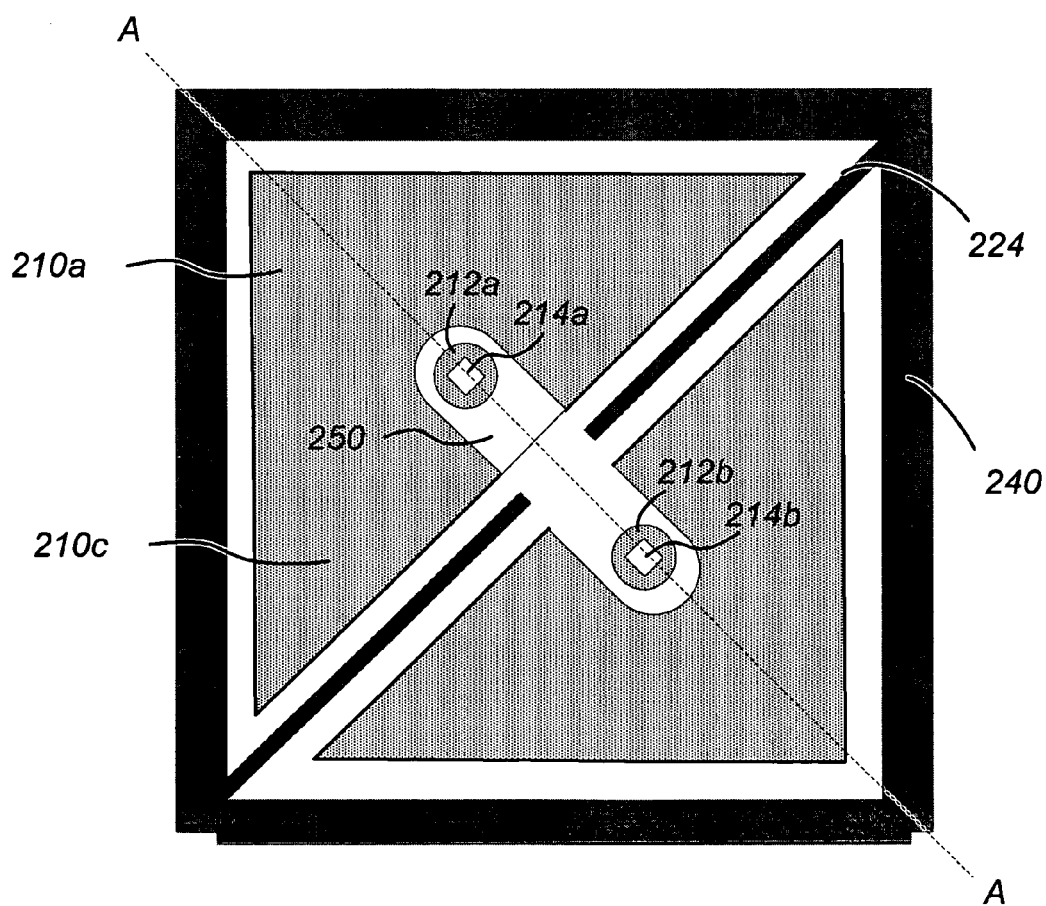
FIGS. 2B and 2C are simplified top-view illustrations of portions of a spatial light modulator according to an embodiment of the present invention.
Figure 2C:
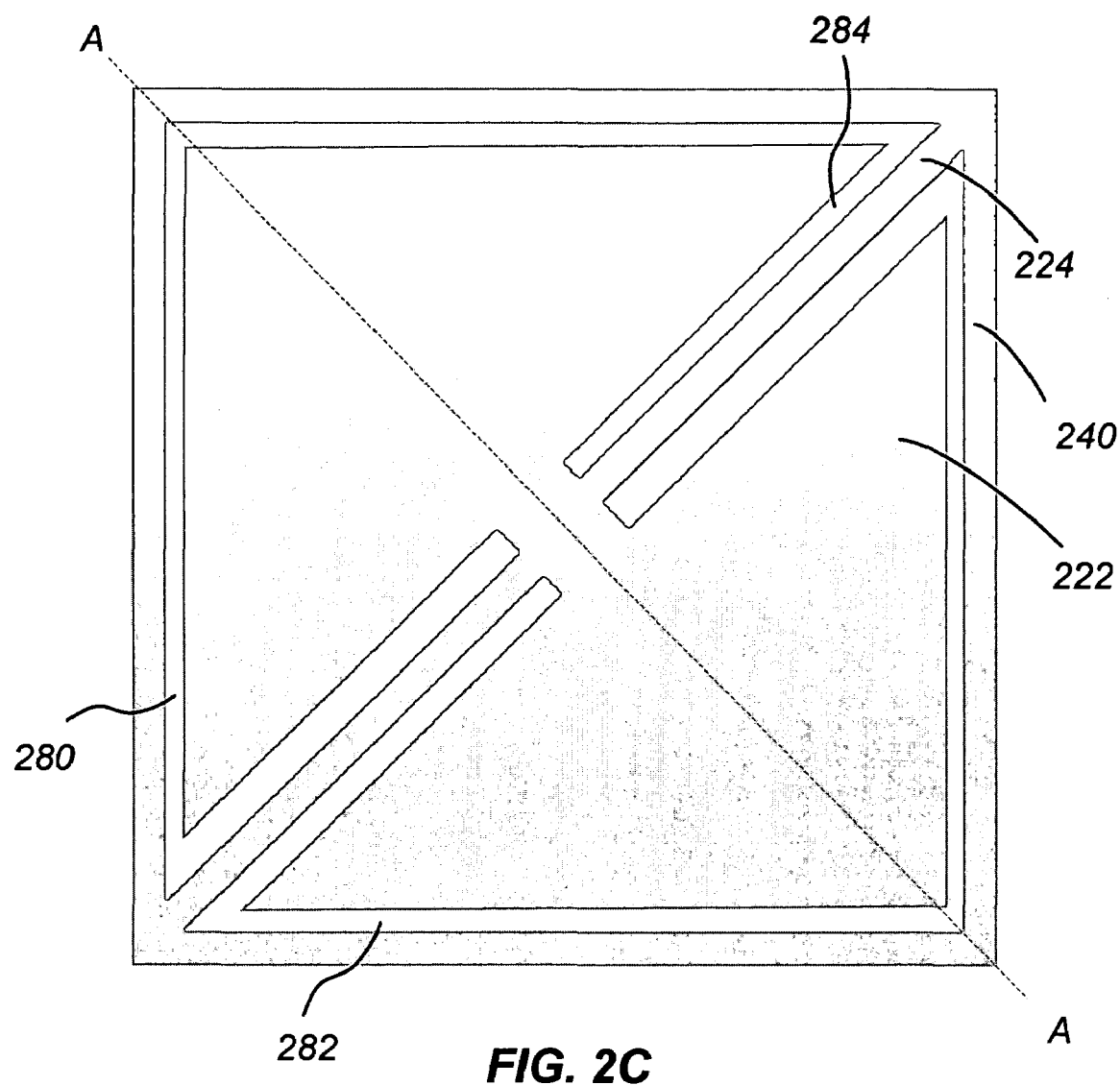

FIG. 2A is a simplified cross-sectional illustration of a spatial light modulator according to an embodiment of the present invention. This diagram is merely an example, which should not unduly limit the scope of the claims herein. One of ordinary skill in the art would recognize many variations, modifications, and alternatives. FIGS. 2A to 2C are related and FIG. 2A is a cross-section along line A—A as illustrated in FIGS. 2B and 2C. As illustrated in FIG. 2A, a surface 207 is provided with at least one electrically activated electrode 210 coupled to the first surface. The first surface can be made of any suitable material. The suitable material generally has mechanical stability and an ability to be processed using semiconductor processing techniques. As merely an example, the material can be a semiconductor. Preferably, the first surface is made from a silicon wafer, processed according to semiconductor processing techniques. Other materials may also be used in alternative embodiments according to the present invention.

The electrically activated electrode 210 is coupled to the first surface. The electrode can be made of materials that conduct electricity. Merely by way of example, the electrode in the embodiment according to the present invention illustrated in FIG. 2A is made of a metal preferentially deposited on the first surface. Preferably, the electrode is made of a multilayer stack of deposited titanium nitride, aluminum, and titanium nitride layers. In alternative embodiments according to the present invention, the electrode is made of greater of lesser numbers of layers, which may include other suitable conductors, such as tungsten.

Moveable structure 220 is attached to a support structure (partially represented by standoff structures 240) by flexible member 224 and the support structure is coupled to the substrate 205. Additional details regarding the support structure is provided with respect to FIGS. 2B and 2C, discussed below. In the embodiment illustrated in FIG. 2A, a portion of the upper surface 222 of the moveable structure is a reflective surface. For example, the power reflectance of portions of upper surface 222 may be greater than or equal to 90%. Moreover, in an embodiment according to the present invention, the flexible member is a torsion spring, but this is not required by the present invention. Alternative embodiments according to the present invention use other flexible members that bend in response to applied forces and subsequently return to their original shape after removal of such applied forces.

In the state illustrated in FIG. 2A a voltage $V_A$ has been applied to the electrode 210, deflecting the left side of the moveable structure away from the electrode and creating a restoring counter-clockwise torque in the flexible member. As the distance between the right side of the moveable structure and the first surface decreases, an interaction with one or more parasitic forces produces a force that acts on the moveable structure. In an embodiment according to the present invention, at least one landing post 214b is adapted to make contact with the suspended member at location 232, thereby maintaining an outer portion of the moveable structure free from physical contact with the first surface or the electrodes 210 and reducing a magnitude of one or more parasitic forces. The landing post is fabricated from suitable materials as will be described more fully below. Additional details regarding the fabrication of landing posts can be found in U.S. patent application Ser. No. 11/031,976, filed Jan. 7, 2005, commonly owned, and hereby incorporated by reference for all purposes.

As illustrated in FIG. 2A, landing posts 214 are coupled to landing post support structures 212. In a specific embodiment, landing posts 214 are fabricated to form electrical contact with landing post support structures 212, which are electrically coupled to a bias grid (not shown). As illustrated, landing post support structures 212 are electrically isolated from electrodes 210. Typically, the bias grid is electrically connected to the moveable structure. In some embodiments, the bias grid is present on the same masking level as the electrodes 210 and landing post support structures 212. In alternative embodiments, the bias grid is present on the same masking level as metals deposited and patterned prior to electrodes 210 and landing post support structures 212. In these alternative embodiments, the bias grid is electrically connected to the landing post support structures 212 through the use of vias, reducing the number of physical structures present at the electrode masking level and simplifying the electrical design. One of ordinary skill in the art would recognize many variations, modifications, and alternatives. Thus, in some embodiments of the present invention, the landing posts serve both a mechanical function as a landing post and an electrical function in carrying the bias grid signal.

In some embodiments of the present invention, the landing posts are formed from a material selected for such properties as electrical conductivity and mechanical rigidity. For example, in one embodiment, the landing posts are formed from tungsten. In other embodiments, other materials, including polysilicon and aluminum are used to form the landing posts. Of course, one of ordinary skill in the art would recognize many variations, modifications, and alternatives.

In embodiments according to the present invention, the height, length, and width of the landing posts 214 are predetermined values. In the embodiment illustrated in FIG. 2A the landing post is formed using a tungsten via plug process. Some embodiments of the present invention utilize conventional design rules for the tungsten via plug process. For example, tungsten plugs with circular cross-sections and a diameter of about 0.4 µm are used in a specific embodiment. In an alternative embodiment, square tungsten plugs having a cross-sectional side length of about 0.4 µm are utilized. In these embodiments, the plug-to-plug spacing is typically about 0.6 µm and the plug height is about 0.8 µm. Of course, the specific dimensions utilized for the via plugs vary in other embodiments as a function of the design rules for the particular process.

In the embodiment illustrated in FIG. 2A, the height, width, and length of the via plugs define a plurality of side surfaces oriented in planes generally normal to the first surface and the electrically activated electrode. In the embodiment illustrated in FIG. 2A, both the individual and combined surface areas of these side surfaces is larger than the surface area of the top of the landing post. In embodiments in accordance with the present invention, the top of the landing post will contact the moveable member when the moveable member is in an activated state. The small surface area of the top of the landing post will reduce the magnitude of stiction forces in comparison with the stiction forces that would result from the moveable member coming into contact with the contact pad in as illustrated in FIG. 1.

Moreover, in embodiments according to the present invention, the distance 230 from the flexible member to the landing post is a predetermined distance. In the embodiment illustrated in FIG. 2A, the distance from the flexible member to the landing post is about 5 µm. Alternatively, the distance ranges from about 1 µm to about 8 µm in other embodiments.

Of course, the distance from the flexible member to the landing post will depend on the particular applications. In some embodiments according to the present invention, the distance from the flexible member to the landing post is reduced to reduce the parasitic torque present at the flexible member. This parasitic torque is a function of the distance from the landing post to the flexible member and the component of the parasitic force ($F_S$) perpendicular to the moveable structure, present at the top of the landing post, which acts on the moveable structure.

In embodiments according to the present invention, the height and position of the landing posts are selected so that the upper surface of the moveable structure is tilted at a predetermined angle with respect to the horizontal when the moveable structure is in the activated state. In embodiments according to the present invention in which the upper surface of the moveable structure comprises reflective portions, an incident ray of light will be reflected at predetermined angles depending on the tilt angle of the moveable structure. In the embodiment illustrated in FIG. 2A, the height and position of the landing posts are selected so that the moveable structure is tilted at an angle of 12° with respect to the horizontal in the activated state. Alternative embodiments have either increased or decreased tilt angles with respect to the horizontal.

Moreover, in embodiments according to the present invention, the length of the moveable structure along direction 230 is a predetermined length. In the embodiment illustrated in FIG. 2A, this length is about 15 µm. Alternatively, the length ranges from a few microns to several hundred microns in other embodiments. Of course, the length of the moveable structure along direction 230 will depend on the particular applications.

Preferably, the dimensions of the moveable structure are selected so that when the moveable structure makes contact with the landing post, the right edge of the moveable structure is at a predetermined distance above the surface 207. As illustrated, the right edge of the moveable structure does not make contact with the surface 207 or the electrodes 210, thereby reducing stiction forces associated with contact between the moveable structure and the surface 207 or electrodes 210. Depending on the application, the separation distance is selected to modify one or more parasitic forces and/or modify the tilt angle of the moveable structure.

As illustrated in FIG. 2A and described more fully below, standoff structures 220 are fabricated as part of the device substrate 205, and not formed from the substrate including layer 220. Consequently, the thickness of layer 220 is reduced in some embodiments, reducing the cost of the SOI substrate. Moreover, as the thickness of layer 220 is decreased, the uniformity of the layer may be increased, resulting in increased uniformity of the micro-mirrors fabricated in layer 220 according to some embodiments of the present invention. In addition, the formation of the standoff structures as an integrated structure on substrate 205 enables the removal of the etching step used to form support members 156 as illustrated in FIG. 1. Referring to FIG. 1, the morphology of surface 162, rather than being defined by the etch process, is a function of the processed used to fabricate the SOI substrate. Accordingly, polishing and finishing steps may be used to provide a smoother surface for layer 220 than typically produced by an etch process. Additional details regarding the fabrication of standoff structures can be found in U.S. patent application Ser. No. 11/028,946, filed Jan. 3, 2005, commonly owned, and hereby incorporated by reference for all purposes.

Device substrate 205 includes a number of layers, of which only a selected few are illustrated in FIG. 2A. One layer illustrated in the figure includes electrodes 210a/210c and 210b/210d. In one embodiment, electrode 210a/210c is an electrode adapted to control the tilt of the micro-mirror in a first direction and electrode 210b/210d is an electrode adapted to control the tilt of the micro-mirror in a second direction opposite to the first direction. As will be evident to one of skill in the art, additional metal, insulator, and via layers as well as other devices are typically fabricated on substrate 205. In some embodiments of the present invention, these additional layers and devices include CMOS circuitry fabricated in processing steps prior to the formation of the electrodes 210 and utilized to drive the electrodes. In a particular embodiment, these layers, along with the layer including electrodes 210 are fabricated using standard CMOS processes.

To provide a vertical clearance between electrodes 210 and layer 220, in which micro-mirrors are formed in one embodiment, standoff structures 240 are formed on the surface of substrate 205. In embodiments according to the present invention, the standoff structures have predetermined dimensions. In an embodiment according to the present invention, the height of the standoff structure is about 1.9 µm. Alternatively, the height ranges from about 0.5 µm to about 2.5 µm in other embodiments. Of course, the height will depend upon the particular applications. Additionally, the lateral dimensions of the standoff structures are predetermined. In the embodiment illustrated in FIG. 2A, the standoff structures have a lateral width of about 0.5 µm and are formed in a two-dimensional pattern extending into the plane of the figure. In alternative embodiments, the lateral width of the standoff structures ranges from about 0.25 µm to about 1.0 µm.

The dimensions of the standoff structures in some embodiments are defined in relation to the dimensions of the micro-mirrors formed in layer 220. For example, in a specific embodiment, the tilt angle of the micro-mirrors in an activated state is 12°. Therefore, the width, length, and depth of the micro-mirrors, along with the relationship of the micro-mirrors to the hinges upon which the micro-mirrors rotate, may be used as inputs in the determination of the standoff structure dimensions. Merely by way of example, for square micro-mirrors with diagonal hinges running from corner to corner, the distance from the center of the micro-mirror to the corner of the micro-mirror will define the hypotenuse of a right triangle. The tilt angle of 12° will define the angle between the bottom of the right triangle and the hypotenuse. Thus, one may calculate the minimum height of the standoff structure for which contact is made between the corner of the micro-mirror and substrate 205 when the micro-mirror is in the activated state. Of course, electrodes extending above the surface of substrate 205, along with other device features, will impact the calculation process and the results produced.

As illustrated in the FIG. 2A, the standoff structures 240 are fabricated from silicon oxide ($Si_xO_y$), but this is not required by the present invention. Other suitable materials may be used within the scope of the present invention. For example, standoffs fabricated from silicon nitride ($Si_xN_y$) are utilized in alternative embodiments. In yet other embodiments, silicon oxynitride (SiON), combinations of the above layers, and the like are used to fabricate the standoff structures. Moreover, polysilicon material, including amorphous polysilicon, is utilized in yet another alternative embodiment according to the present invention. Materials with suitable characteristics, including formation of a strong bond with layer 220, good adhesion to substrate 205, and mechanical rigidity, are acceptable substitutes for $Si_xO_y$ materials.

Moreover, in some embodiments of the present invention, the process used to deposit the layer or layers from which the standoff structures are fabricated is performed in light of the structures present on the device substrate. For example, some CMOS circuitry may be adversely impacted by performing high temperature deposition processes, as these high temperature deposition processes may damage metals or result in diffusion of junctions associated with the CMOS circuitry. Thus, in a particular embodiment of the present invention, low temperature deposition, patterning, and etching processes, such as processes performed at temperatures of less than 500° C., are used to form the layer from which the standoff structures are fabricated. In another specific embodiment, deposition, patterning, and etching processes performed at less than 400° C., are used to form the layer from which the standoff structures are fabricated.

FIG. 2B is a simplified top-view illustration of portions of a spatial light modulator according to an embodiment of the present invention. In relating FIG. 2B to FIG. 2A, the cross-section along line A—A in FIG. 2B corresponds to the cross-section illustrated in FIG. 2A. Thus, the dashed lines between electrodes sections 210a and 210c in FIG. 2A are illustrated as the same sections 210a and 210c in FIG. 2B, with landing post support structures 212a and landing posts 214a approximately centrally located on electrode 210a/210c. Electrode 210a/210c, which has a generally triangular shape when viewed from the top, has a indented region 250 that provides for physical and electrical separation of landing post support structures 212a and 214a from the electrode. Moveable structure 220 is omitted for purposes of clarity in FIG. 2B with the exception of flexible member 224. Complementary structures are illustrated in the figure, including landing post support structure 212b and landing post 214b.

As illustrated in FIG. 2B, landing post 214a has a square cross-sectional area. As discussed previously, this particular geometry is not required by embodiments according to the present invention. Moreover, although landing post support structure 212a is illustrated with a circular cross-sectional area, this also is not required by embodiments according to the present invention. Alternative shapes are provided in alternative embodiments according to the particular application. Moreover, the distance from the landing post to the flexible member is variable depending on the particular application. As discussed above, the parasitic torque is a function of the distance from the landing post to the flexible member and the component of the parasitic force $F_S$ perpendicular to the moveable structure, present at the top of the landing post. Thus, decreasing the distance from the landing post to the flexible member by moving the position of the landing post will influence the parasitic torque associated with the spatial light modulator.

Embodiments according to the present invention provide electro-mechanical mirror systems configured to controllably reflect incident optical radiation. However, the present invention is applicable to a broad class of electro-mechanical systems in which parasitic forces are present. For many electro-mechanical systems, proper device functionality necessitates incorporation of design elements directed at reducing the magnitude and impact of parasitic forces. For example, many MEMS feature design elements directed at reducing stiction forces. Embodiments in accordance with the present invention reduce parasitic forces in this class of electro-mechanical systems and particularly in MEMS.

FIG. 2C is a simplified top-view illustration of additional portions of a spatial light modulator according to an embodiment of the present invention. FIG. 2C illustrates the top surface of standoff structure 240, torsion spring hinge 224 and the top of mirror surface 222 for a single cell of a spatial light modulator. As illustrated in FIG. 2C and described more fully below, portions of the mirror layer have been selectively removed to form spaces 280 and 282 between the standoff structure and the mirror surface. Moreover, spaces 284 have been formed between the mirror surface and torsion spring hinge 224 enabling the mirror to rotate around the longitudinal axis of the hinge as a result of actuation by the electrodes illustrated in FIG. 2B. Although the features are defined by right angles and acute angles, one of skill in the art will appreciate that other suitable etch profiles may be used to provide similar functionality.

Figure 3A:
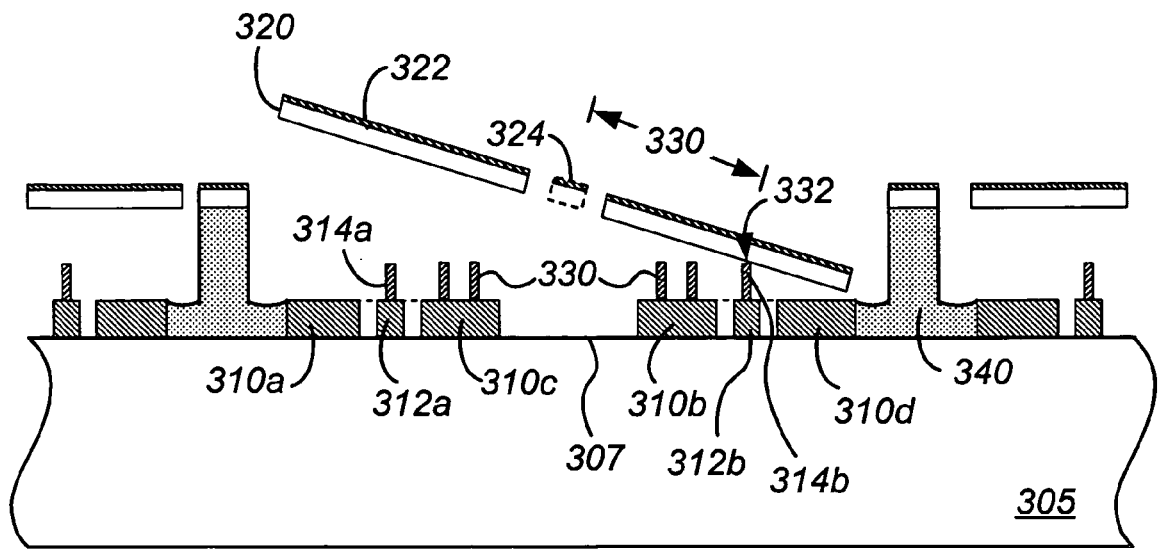
FIG. 3A is a simplified cross-sectional illustration of a spatial light modulator according to another embodiment of the present invention.

FIG. 3A is a simplified cross-sectional illustration of a spatial light modulator according to another embodiment of the present invention. The spatial light modulator illustrated in the figure incorporates features of the embodiment illustrated in FIG. 2A and further includes secondary electrode structures 330 coupled to electrodes 310*c* and 30*b*. When a voltage bias is applied between the moveable structure 320 and the electrodes 310, the mirror plate is deflected due to electrostatic attraction. The electric field resulting from an electric potential applied to the electrode decreases as a function of distance from the electrode 310. Accordingly, secondary electrodes 330 effectively extend the height of the electrode above that provided by the metals deposited to form the electrode, effectively decreasing the distance between the electrodes and the moveable structure, thereby increasing the magnitude of the electric field experienced by the moveable structure 320.

In a specific embodiment, the secondary electrodes 330 are fabricated during the same via plug formation process as that used to fabricate the landing posts 314*a* and 314*b*. The dimensions of the secondary electrodes are pre-selected depending on the design rules selected for the via plug formation process. In some embodiments, the secondary electrodes have the same dimensions as the landing posts, but this is not required by embodiments of the present invention. As described above, typically the landing posts are formed from a material selected for such properties as electrical conductivity and mechanical rigidity. For example, in one embodiment, the secondary electrodes and the landing posts are formed from tungsten. In other embodiments, other materials, including polysilicon and aluminum are used to form the secondary electrodes and the landing posts. Therefore, in one specific embodiment, a tungsten plug formation step produces structures that provide both mechanical (landing post) and electrical (secondary electrode) functions.

Figure 3B:
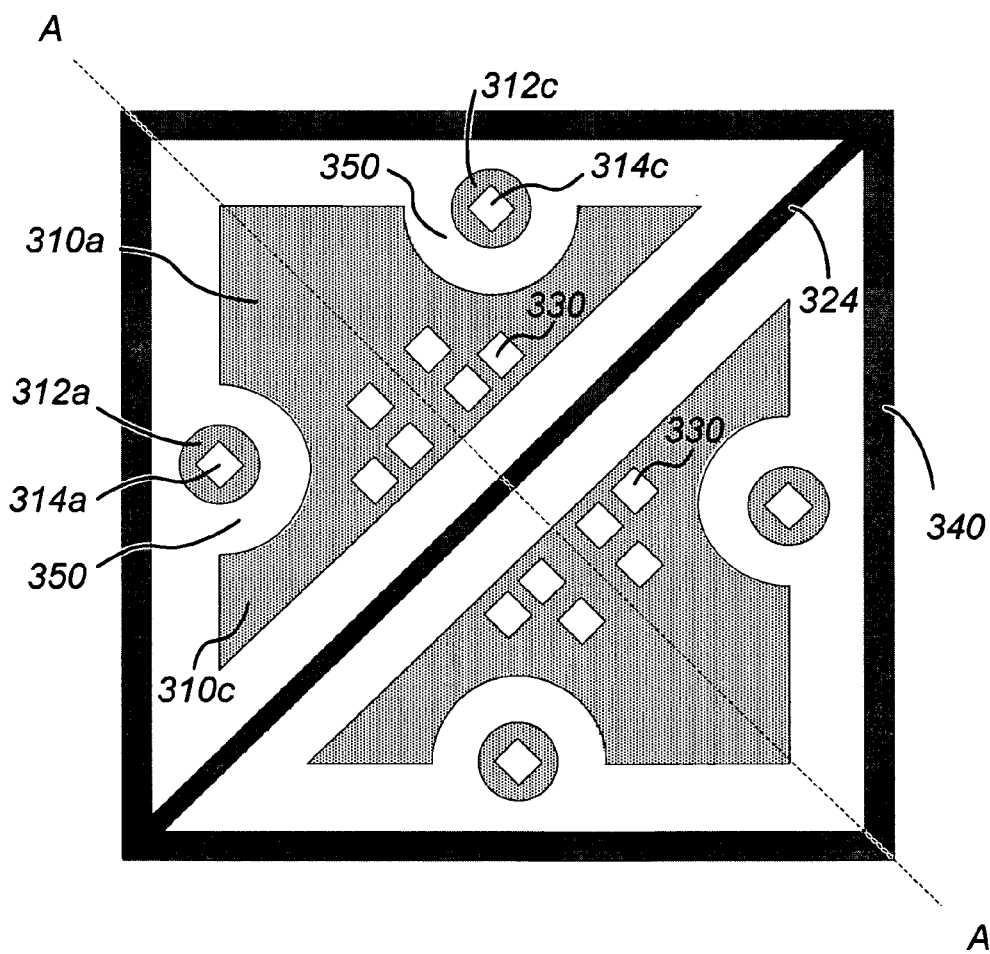
FIG. 3B is a simplified top-view illustration of a spatial light modulator according to another embodiment of the present invention.

FIG. 3B is a simplified top-view illustration of a spatial light modulator according to another embodiment of the present invention. As shown in the figure, electrode 310 has a generally triangular shape when viewed from the top. However, in a design differing from that illustrated in FIG. 2B, two landing posts 314*a* and 314*c* are provided at several locations with respect to the flexible member 324. Inset in two sides of the generally triangular electrode 310 are semi-circular indented regions 350, which provide for physical and electrical isolation of structures 312 and 314 from the electrode. Although the indented regions are semi-circular in shape in FIG. 3B, this is not required by embodiments of the present invention. Alternative shapes are utilized in alternative embodiments according to the present invention. Moreover, the number and placement of the landing posts are varied in particular embodiments of the present invention as will be evident to one of skill in the art. The placement of the landing posts at the edges of the generally triangular electrode is merely one example of possible placements utilized in embodiments of the present invention.

Secondary electrodes 330 are fabricated at pre-selected locations on electrode 310 in FIG. 3B. Although only twelve secondary electrodes are illustrated in the figure, this is merely one example of a secondary electrode arrangement. Arrangement with a different number of secondary electrodes and/or with a different placement pattern are utilized in alternative embodiments.

Figure 4A:
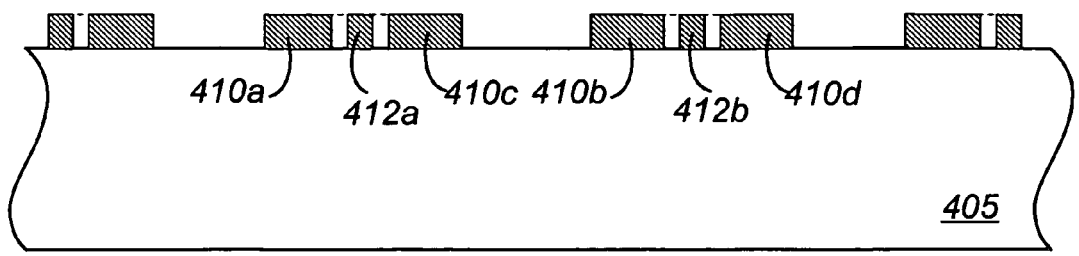
FIGS. 4A–4H and 4J–4L are simplified cross-sectional illustrations of a process flow for fabricating a spatial light modulator according to an embodiment of the present invention.

FIGS. 4A–4H and 4J–4L are simplified cross-sectional illustrations of a process flow for fabricating a spatial light modulator according to an embodiment of the present invention. As illustrated in FIG. 4A, a substrate 405 is provided. Substrate 405 can be made of any suitable material. The suitable material generally has mechanical stability and an ability to be processed using semiconductor processing techniques. As merely an example, the material can be a semiconductor. Preferably, the first surface is made from a single crystal silicon wafer, processed according to semiconductor processing techniques. Other materials may also be used in alternative embodiments according to the present invention. In an embodiment of the present invention, the silicon wafer is processed using standard CMOS processing techniques to form an array of control circuitry and electrodes on the substrate. Additional details regarding one example of the fabrication of the control circuitry and electrodes are described in U.S. application Ser. No. 10/756,923, filed Jan. 13, 2004, commonly owned and hereby incorporated by reference for all purposes.

As illustrated in FIG. 4A, a number of electrodes 410 are coupled to the surface of substrate 405. Preferably, the electrodes are made of a multilayer stack of deposited titanium nitride, aluminum, and titanium nitride layers. In some embodiments, the electrodes 410 are distributed in an array pattern and coupled to addressing and control circuitry (not shown). Each electrode is associated with a micro-mirror and controls the deflection of that micro-mirror. The addressing and control circuitry allow the selection and activation of particular electrodes to control the deflection of the micro-mirror associated with that electrode. Electrodes 410*a* and 410*c* are associated with each other and in some embodiments, are used to control the electric field created on one side of a micro-mirror. Electrodes 410*b* and 410*d* are associated with each other and in some embodiments, are used to control the electric field created on the other side of the micro-mirror. As an example, a micro-mirror associated with electrode 410 may have a left side, influenced by the electric field associated with electrodes 410*a* and 410*c* and a right side, influenced by the electric field associated with electrodes 410*b* and 410*d*.

Landing post support structures 412*a* and 412*b* are electrically isolated from electrodes 410 in the embodiment illustrated in FIG. 4A. Moreover, a bias grid (not shown) is electrically connected to the landing post support structure. In some embodiments, the bias grid is present on the same masking level as the electrodes 410 and landing post support structures 412. In alternative embodiments, the bias grid is present on the same masking level as metals deposited and patterned prior to electrodes 410 and landing post support structures 412. In these alternative embodiments, the bias grid is electrically connected to the landing post support structures 412 through the use of vias, reducing the number of physical structures present at the electrodes masking level and simplifying the electrical design. One of ordinary skill in the art would recognize many variations, modifications, and alternatives. Thus, in some embodiments of the present invention, the landing post support structures serve both a mechanical or support function for the landing posts and an electrical function in carrying the bias grid signal to the landing posts.

As illustrated in FIG. 4A, the electrodes 410 and the landing post support structures 412 are defined on the same masking level, simplifying the process flow. In alternative embodiments, the landing post support structures are defined by masking levels prior to or subsequent to the masking levels associated with the electrodes. One of ordinary skill in the art would recognize many variations, modifications, and alternatives. Although the electrodes and landing post support structures illustrated in FIG. 4A may be defined on the same masking level, they are electrically isolated from each other in some embodiments of the present invention. The dashed lines joining the upper surfaces of the electrodes 410a and 410c illustrate examples of the present invention in which the electrode extends either behind or in front of the landing post support structure, or both. Referring back to FIG. 2B, a side view of the illustrated spatial light modulator along a line perpendicular to cross-section A—A would show the electrode 210 both in front of and behind the landing post support structure 212a when viewed along the line. Thus, although for purposes of clarity the electrode is illustrated as straddling the landing post support structure in FIG. 4A, this is not required by the present invention. In fact, referring to the simplified top-views illustrated in FIGS. 2B and 3B, one of skill in the art will appreciate a number of possible spatial relationships between the electrodes and the landing post support structures.

Figure 4B:
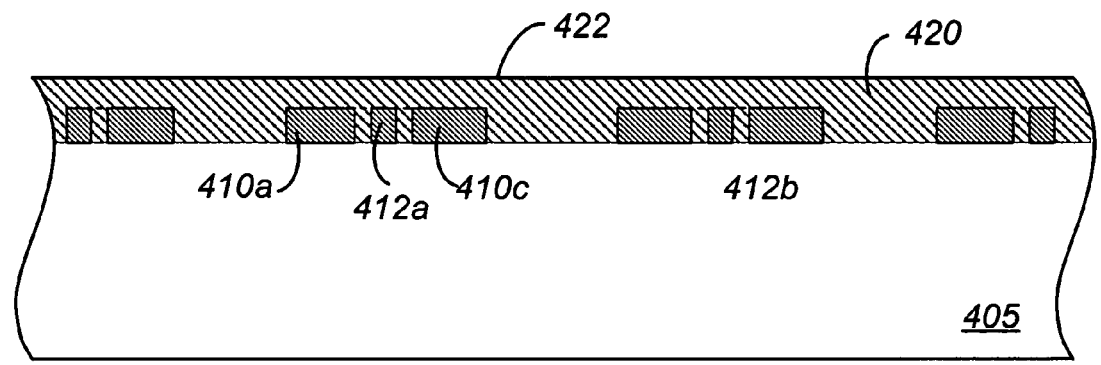

FIG. 4B illustrates a step of the process flow in which a dielectric layer 420 is deposited on substrate 405. In a specific embodiment, the dielectric layer is a silicon oxide layer commonly used in pre-metal dielectric (PMD) and intermetal dielectric (IMD) multilevel interconnect applications, but this is not required by the present invention. Alternative embodiments utilize layers of silicon nitride, silicon oxynitride, spin-on-glass (SOG), low-k dielectrics, or the like. Moreover, dielectric layer 420 may be formed by a combination of such layers. Preferably, the dielectric layer 420 is formed by a low temperature process that preserves the integrity of the control circuitry and electrodes fabricated on substrate 405 in previous processing steps. For example, a low temperature plasma enhanced chemical vapor deposition (PECVD) process is used in one embodiment to deposit an oxide and form the dielectric layer 420. Alternative embodiments employ atmospheric or low pressure chemical vapor deposition (CVD) processes to form the dielectric layer. The dielectric layer may be planarized after deposition, for example, by using a chemical mechanical polishing (CMP) process to form a uniform upper surface 422. Planarization processes for dielectric layers utilized in multilevel interconnect applications are well known to one of skill in the art.

Figure 4C:
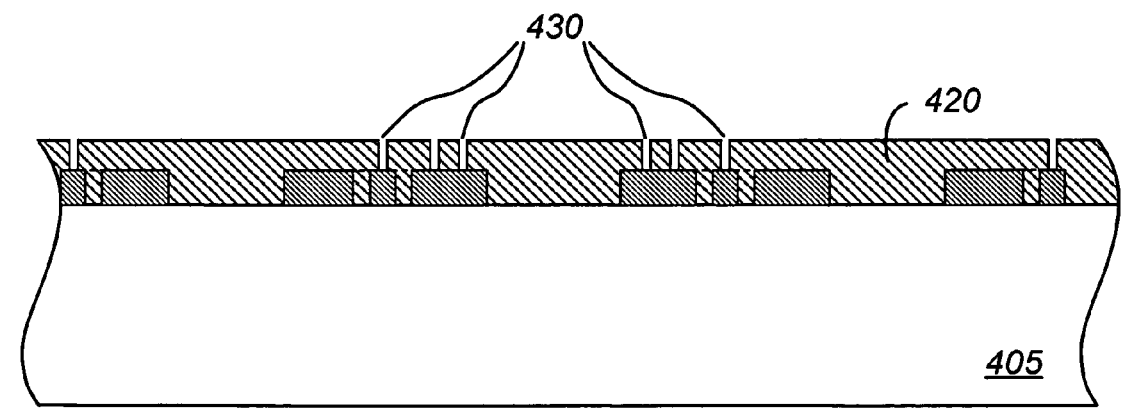

FIG. 4C illustrates the patterning and etching of dielectric layer 420 to form a number of openings 430. In a typical process, a photoresist layer is deposited, exposed, and developed to form a patterned layer of photoresist. The patterned photoresist layer is used as an etch mask to selectively remove portions of the dielectric layer as illustrated by openings 430 in the figure. In an alternative embodiment, an etch mask layer is deposited prior to the formation of the photoresist layer. The etch mask layer is patterned using the photoresist layer as a pattern mask and subsequently used as an etch mask to selectively remove portions of the dielectric layer. Openings 430 are formed at a number of locations coupled to the electrodes 410 and the landing post support structures 412. In some embodiments, the openings 430 are fabricated using processes developed for forming contact holes through PMD layers and vias through IMD layers.

Figure 4D:
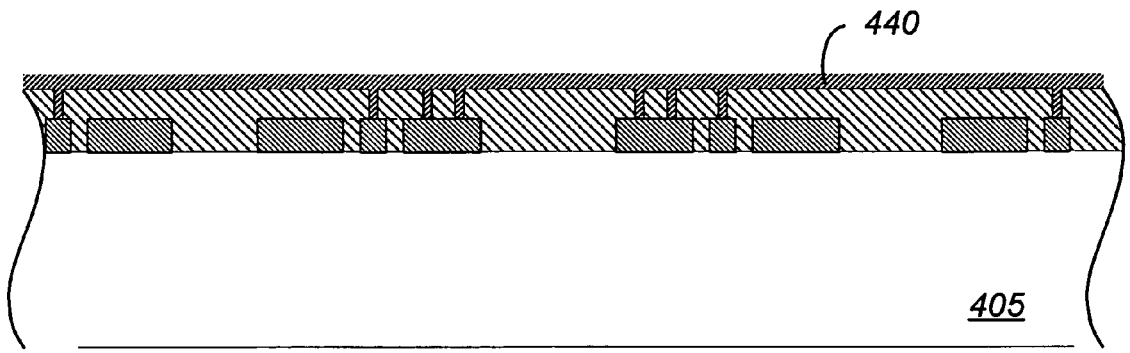

FIG. 4D illustrates the deposition of an electrically conductive layer 440 in contact with the dielectric layer. As illustrated, the electrically conductive layer has been deposited as a gap fill layer that fills the contact or via holes 430 and also covers the flat areas on the upper surface 422 of the dielectric layer. In a particular embodiment, the deposition of layer 440 is performed using standard gap fill processes commonly used for filling tungsten contact holes through PMD layers and vias through IMD layers. As such, in this particular embodiment, the tungsten plug completely fills the openings 430 without the formation of voids. In some embodiments, a generally conformal liner layer commonly used in contact hole/via plug formation processes is deposited prior to the deposition of electrically conductive layer 440. Merely by way of example, the conformal liner layer may be formed as a TiN, TiW, or Ti layer or combination thereof. One of ordinary skill in the art would recognize many variations, modifications, and alternatives. In alternative embodiments, the electrically conductive layer is formed using other materials, including polysilicon and aluminum.

Figure 4E:
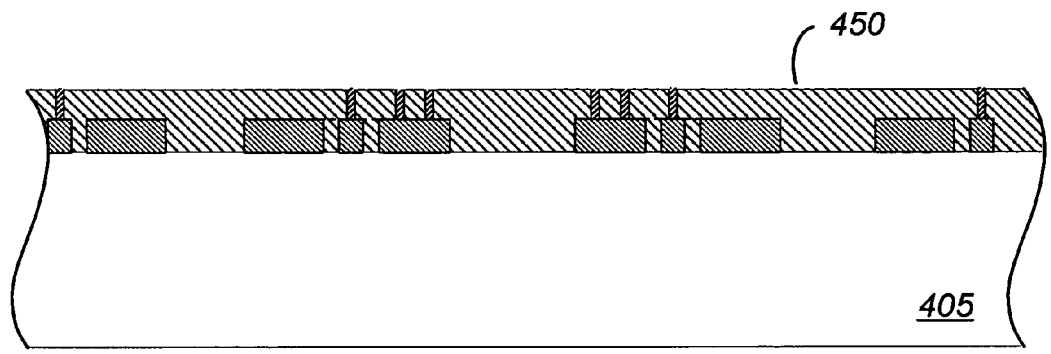

FIG. 4E illustrates the planarization of layer 440 to form a planarized upper portion 450 of the electrically conductive layer. In one embodiment, the planarization of the electrically conductive layer is accomplished by the use of a CMP process. In some embodiments, the planarization of the layer 440 produces a local surface root-mean-square (RMS) roughness for the surface of layer 450 on the order of 5 Å. As illustrated in FIG. 4E, the planarization step has resulted in the exposure of dielectric layer 420, however this is not required by the present invention. Alternative embodiments preserve a continuous portion of layer 440 as appropriate to particular applications.

Considering FIGS. 4B–4E, one of skill in the art will recognize that the illustrated process flow is representative of commonly utilized PMD and IMD tungsten plug formation processes: deposition and patterning of the PMD or IMD layer followed by tungsten plug deposition and subsequent planarization through CMP. Thus, well-developed and well-characterized semiconductor processes are used in embodiments of the present invention, simplifying process integration issues. Moreover, these processes produce void free tungsten plugs suitable for use as landing posts.

Figure 4F:
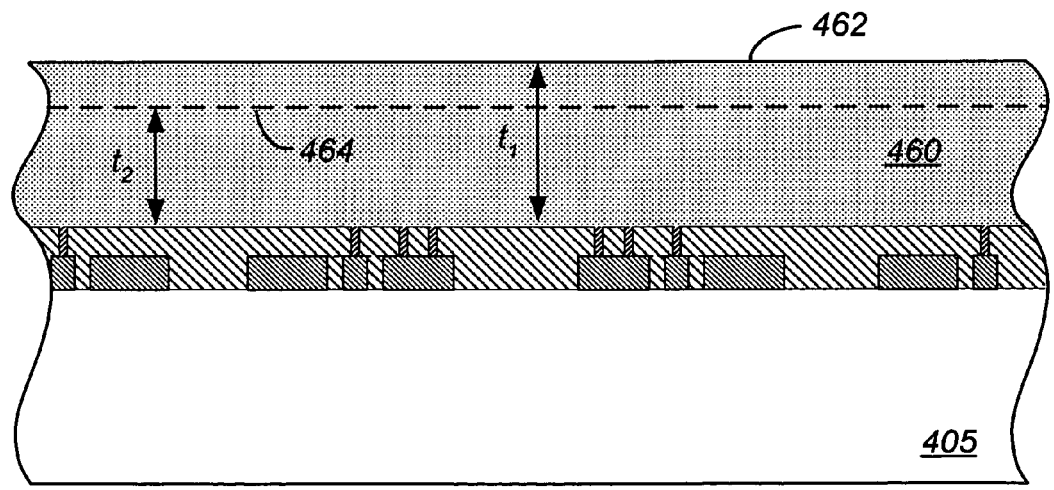

FIG. 4F illustrates another stage in a process flow performed according to an embodiment of the present invention. Substrate 405 is provided and processed as described above. As illustrated in FIG. 4F, standoff layer 460, with a thickness of $t_1$, is deposited on layers coupled to substrate 405. Standoff layer 460 is a silicon dioxide ($SiO_2$) layer in a specific embodiment of the present invention, but as described above, this is not required by the present invention. Other suitable materials may be used within the scope of the present invention. For example, layer 460 is formed by deposition of silicon nitride ($Si_3N_4$) or silicon oxynitride (SiON) layers in alternative embodiments. Moreover, polysilicon material, including amorphous polysilicon, is deposited to form layer 460 in yet another alternative embodiment according to the present invention. Of course, combinations of these layers and the like may also be used in embodiments within the scope of the present invention.

The deposited layer 460 has a predetermined thickness $t_1$ as initially deposited. In a specific embodiment, the thickness $t_1$ is about 2.6 μm. In other embodiments, the thickness ranges from about 1.0 μm to about 3.0 μm. Of course, the thickness will depend on the particular applications. As illustrated in FIG. 4F, the upper surface 462 of the deposited layer 460 is uniform across the substrate 405 in FIG. 4F, resulting in a planar surface. However, a planar surface after deposition is not required by the present invention. In a particular deposition process, the patterned nature of the electrodes 410 results in the thickness of layer 460 varying as a function of lateral position, producing an upper surface 462 that is not entirely flat.

To planarize the upper surface 462 of the deposited layer 460, an optional CMP step is performed in an embodiment of the present invention. The results produced by the CMP process are illustrated by dashed line 464 in FIG. 4F and thickness $t_2$ in FIGS. 4F and 4G. Standoff material present above line 464 is removed during the CMP process, resulting in a highly polished and planaraized layer of thickness $t_2$. In a particular embodiment, the root-mean-square (RMS) roughness of the planarized surface 464 is less than or equal to about 5 Å. As will be described below, the extremely smooth surface produced during the CMP process facilitates bonding of the composite substrate to the device substrate. In embodiments according to the present invention, the height $t_2$ of the standoff structure after the CMP process is about 1.9 μm. Alternatively, the height ranges from about 0.5 μm to about 2.5 μm in other embodiments. Of course, the height will depend upon the particular applications.

Figure 4G:
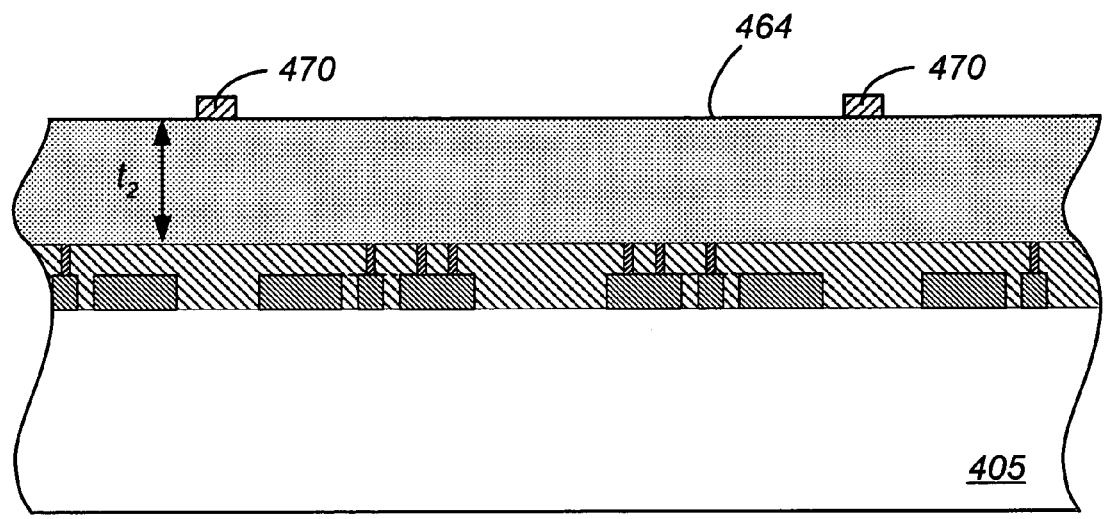
Figure 5:
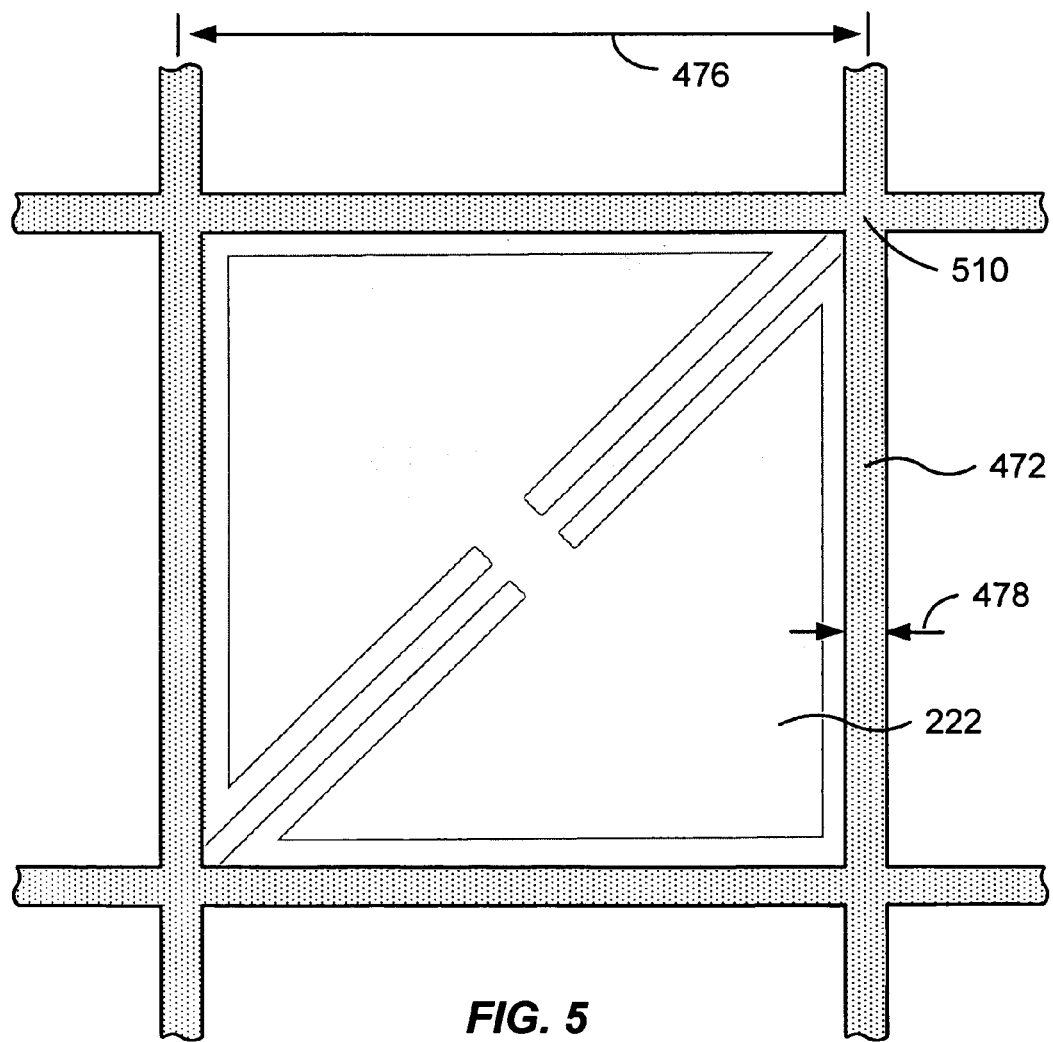
FIG. 5 is a simplified top-view illustration of portions of a spatial light modulator according to an embodiment of the present invention.

FIG. 4G illustrates a photolithography process in which a photoresist layer (and/or other layers) is deposited and patterned to form an etch mask 470 on surface 464 of the standoff layer 460. As illustrated in the figure, the standoff layer has been planarized and thinned to thickness $t_2$, providing surface 464 as the upper surface of the standoff layer. The photolithography process is well known and as will be evident to one of ordinary skill in the art, the dimensions of the etch mask 470 may be tightly controlled during photolithography. Etch mask 470 may be formed from any suitable material that is resistant to the etching process used to etch the standoff material. In a specific embodiment, an etch mask of metal such as Al or TiN is utilized. Although the etch mask 470 is illustrated in one dimension in FIG. 4G, it will evident to one of skill in the art that a two-dimensional pattern may be formed on the surface 464 to produce standoff regions of the desired geometry. Merely by way of example, FIG. 5 illustrates a simplified top view of one two-dimensional pattern possible for the standoff regions.

Figure 4H:
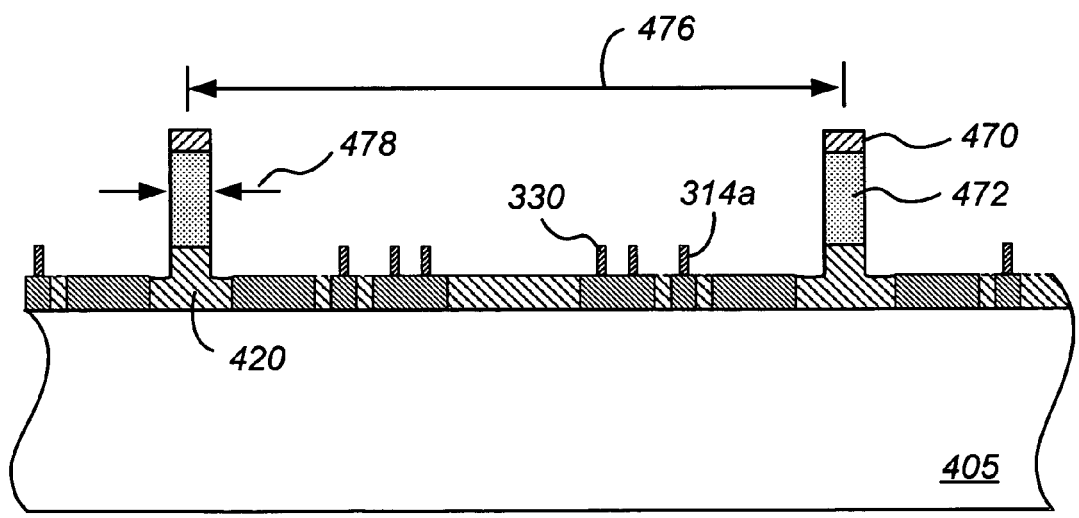

FIG. 4H illustrates substrate 405 and patterned standoff region 472 after an etch process. As illustrated in the figure, portions of the standoff layer 460 have been removed during the etch process, resulting in the formation of standoff regions 472. The lateral dimensions of the standoff regions 472 are a function of the geometry of the etch mask 470 and the etch process. As illustrated in the figure, the center to center spacing between the standoff regions along line 476 is about 13.5 μm. For micro-mirrors with a square shape, the center to center spacing is the same in the direction perpendicular to line 476. Of course, for rectangular micro-mirrors, the spacing in perpendicular directions may vary. Additionally, the micro-mirrors associated with the electrodes will have dimensions smaller than the center to center spacing of the standoff regions, permitting the micro-mirrors to move in response to electrical signals present at the electrodes.

Embodiments of the present invention in which the standoff regions are fabricated from silicon oxide, silicon nitride, or silicon oxynitride, or combinations thereof, provide benefits based on the electrical and thermal properties of the standoff region material. For example, these materials, among others, provide a high degree of electrical insulation, electrically isolating the device substrate from the mirror layer fabricated in subsequent steps. Moreover, the thermal properties of the material used to deposit the standoff layer, such as thermal insulation, are provided by some embodiments. Merely by way of example, light absorbed by micromirrors may increase the temperature of the micro-mirrors. Thus, for instance, a thermally insulating standoff region will reduce the conduction of heat from the micro-mirrors to the device substrate. Other suitable standoff regions materials, such as polysilicon material, including amorphous polysilicon are characterized by electrical and thermal properties that provide benefits in alternative embodiments.

As illustrated in FIG. 4H, an isotropic etch has been used to define the standoff regions 472. The etch profile defines vertical walls for the standoff regions with a predetermined thickness. In the illustration, the lateral thickness 478 of the standoff regions is about 0.5 μm. In other embodiments, the thickness of the standoff regions varies from about 0.25 μm to about 1 μm. As will be evident to one of skill in the art, the fill factor of the spatial light modulator will be a function of the thickness of the standoff regions. Some dishing of the upper surface of the oxide layers 420, deposited between electrodes, occurs in some embodiments of the present invention, but this is not required by the present invention. Additionally, dishing of the oxide 420 adjacent to the standoff region 472 is illustrated in the figure, but this effect is a function of the etch process. An etch process that terminates at the upper surface of the electrodes is used in an alternative process that results in simultaneous exposure of the electrodes and passivation of the surface of the substrate 405. In yet another embodiment, the etching process is terminated prior to exposure of the electrode layer, enabling the standoff layer 460 to not only provide mechanical support in the form of standoff region 472, but additional passivation benefits to the electrodes on substrate 405.

As discussed above, in some embodiments of the present invention, the processes used to deposit, pattern, and etch the layer or layers from which the standoff structures are fabricated are performed at low temperatures. For example, these processing steps may be performed with a view to the structures present on the device substrate prior to the formation of the standoff structures, such as CMOS circuitry. Since some CMOS circuitry may be adversely impacted by performing high temperature deposition processes, which may damage metals coupling CMOS transistors or result in diffusion of junctions associated with the CMOS circuitry, low temperature deposition processes are utilized according to some embodiments of the present invention. Moreover, in a particular embodiment of the present invention, low temperature deposition, patterning, and etching processes, such as processes performed at temperatures of less than 500° C., are used to form and pattern the layer or layers from which the standoff structures are fabricated. In another specific embodiment, deposition, patterning, and etching processes performed at less than 400° C., are used to form the layer from which the standoff structures are fabricated. One of ordinary skill in the art would recognize many variations, modifications, and alternatives within the scope of low temperature processes.

In FIG. 4H, portions of the dielectric layer 460 are removed to expose the landing posts 314 and the secondary electrodes 330. Plasma ashing, among other methods, may be used to remove the dielectric layer. In some embodiments, a dielectric removal process is used that terminates at the upper surface of the electrodes, providing passivation of the electrode surfaces. The embodiments in which the dielectric removal process is terminated at the upper surface of the electrodes results in simultaneous exposure of the secondary electrodes coupled with passivation of the electrodes and underlying surface of the substrate 405. In yet another embodiment, the dielectric removal process is terminated prior to exposure of the electrode layer, exposing the secondary electrodes and the landing posts, while providing additional passivation benefits to the electrodes on substrate 405.

Figure 4J:
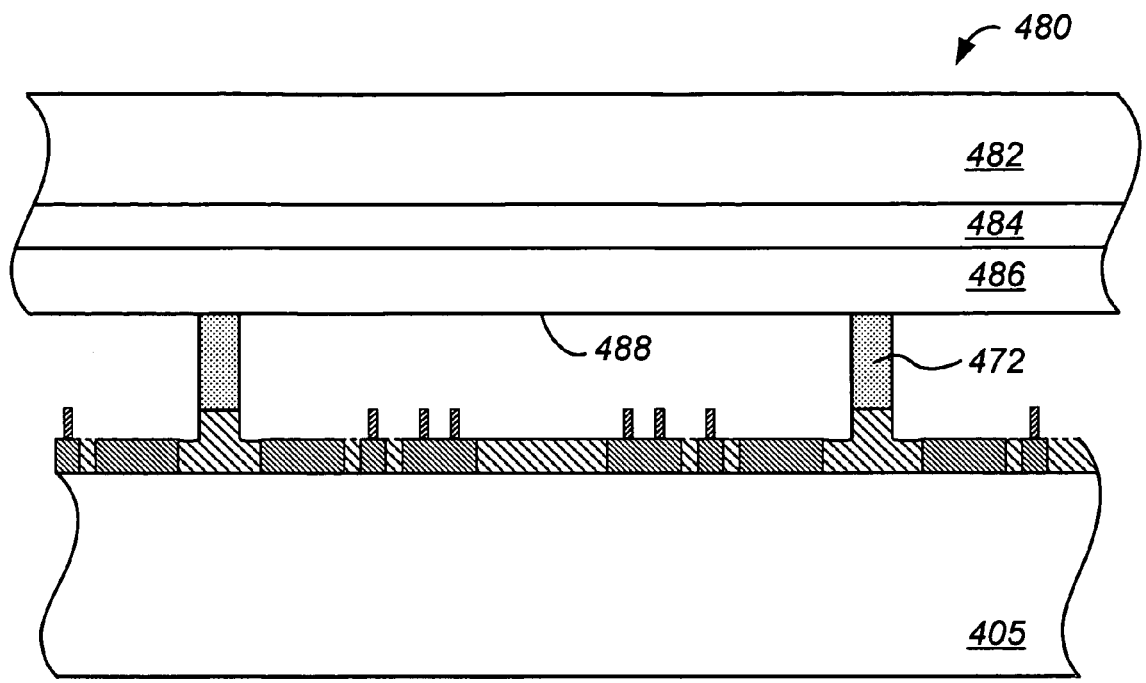

FIG. 4J illustrates a substrate bonding process in which a composite substrate structure is formed. Substrate 480 comprises a multilayer substrate structure with a number of layers. In the illustrated embodiment, an SOI substrate including a layer of silicon (482), a layer of buried oxide (484), and an additional layer of silicon (486) is provided. In a particular embodiment, the silicon layers 482 and 486 are single crystal silicon layers, although this is not required by the present invention. Alternative embodiments according to the present invention include layers of polysilicon, amorphous silicon, and other suitable substrate layers. The buried oxide layer serves as an etch stop in one embodiment of the present invention, in which substrate 480 is thinned by removal of layers 482 and 484 after bonding to substrate 405. In some embodiments of the present invention, the silicon bearing layer 486 may be reduced in thickness compared to the layer of silicon 154 illustrated in FIG. 1.

In a particular embodiment, the bonding surface 488 of layer 486 is a polished single crystal silicon surface. Wafer bonding techniques are used in some embodiments, to form a hermetically sealed cavity in the region bounded by substrate 405, standoff region 472, and layer 486. For example, bonding may be accomplished through the use of anodic, eutectic, fusion, covalent, glass frit, and other bonding techniques. In embodiments in which standoff region 472 and layer 486 are silicon oxide and silicon, respectively, room temperature covalent bonding techniques are used to form a hermetically sealed bond between the substrates. Of course, one of ordinary skill in the art would recognize many variations, modifications, and alternatives.

In alternative embodiments, bonding of the two substrates is performed using a variety of techniques. In a specific embodiment, the bonding occurs using a room temperature covalent bonding process. Each of the bonding surfaces is cleaned and activated, e.g., by plasma activation or by wet processing. The activated surfaces are brought in contact with each other to cause a sticking action. In some bonding processes, mechanical force is provided on each substrate structure to press the bonding surfaces together. In embodiments in which layer 486 is silicon and the standoff regions are silicon oxide, silicon bearing bonds are created between the two faces. In alternative embodiments, an oxide layer is formed on surface 486 prior to bonding to provide an oxide—oxide bond interface. The bonding surface of the layer from which standoff structures are formed is polished by a CMP process in one embodiment while the bonding surface of layer 486 is polished as well, providing an extremely smooth surface that is conducive to covalent bonding processes. Of course, one of ordinary skill in the art would recognize many other variations, modifications, and alternatives.

Although the composite substrate structure is illustrated in two dimensions in FIG. 4J, it will evident to one of skill in the art that a three-dimensional structure is provided by embodiments of the present invention. Standoff region 472 extends into the plane of the figure, forming three-dimensional sealed cavities that surround the electrodes associated with a particular micro-mirror.

Figure 4K:
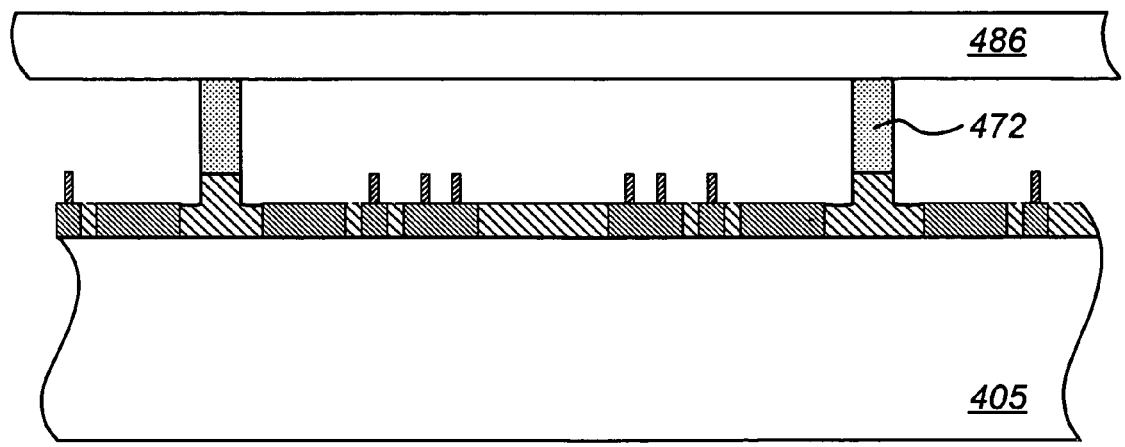

Upper layers of substrate 480 are removed in a subsequent processing step, as illustrated in FIG. 4K. In order to thin substrate 480 after bonding, thinning processes using chemical mechanical polishing (CMP), grinding, etch back, any combination of these, and the like are used. In one application, the buried oxide layer 484 provides an etch stop layer during the thinning process. Plasma ashing is used in some embodiments to remove the buried oxide layer 484 and expose layer 486. After the thinning process, the layer 486 is exposed, making the layer available for the formation of micro-mirrors in layer 486.

Figure 4L:
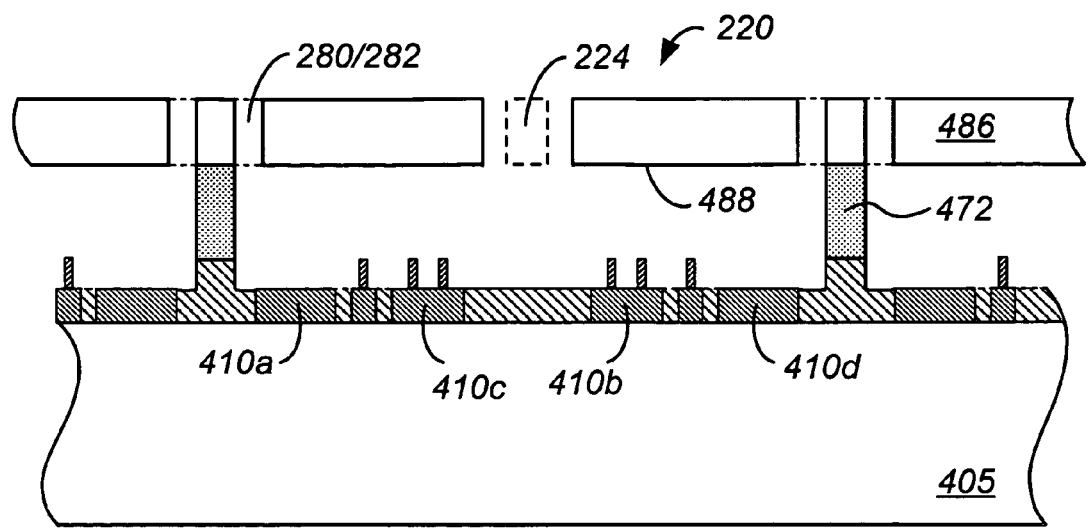

Mirror structures are patterned and fabricated in layer 486 using semiconductor processing techniques as illustrated in FIG. 4L. Mirror 220 has been separated from portions of layer 486 coupled to standoff structures 472 by the formation of etched openings 280 and 282 (see FIG. 2C). At the center of the mirror, a flexible hinge 224 has also been formed by an etching process. Although FIG. 4L illustrates a side view of the spatial light modulator, one of skill in the art will appreciate the three-dimensional nature of the illustrated structures. As illustrated in the figure, the mirror is able to tilt in clockwise and counter-clockwise directions in a plane aligned with the plane of the figure. The motion of the mirror in either the clockwise or counter-clockwise directions is stopped by contact with the landing posts. Although not illustrated in the figure, the surface 488 of the mirror may be processed to form structures complementary to the landing posts. For example, deposited features made from suitable material may be formed on surface 488 and adapted to make contact with the landing posts. These complementary structures may increase the reliability and improve the long-term performance of the spatial light modulator.

Because both the standoff regions and the electrodes are formed on substrate 405, the alignment tolerances for the wafer bonding process are greatly relaxed in comparison to the tolerances present using the structure illustrated in FIG. 1. For example, in some embodiments of the present invention, the tolerance requirement for aligning the two substrates prior to joining is less than 1 cm. Tolerance requirements on the order of millimeters are therefore available through embodiments of the present invention, in contrast to tolerance requirements on the order of microns for the structure illustrated in FIG. 1.

As illustrated in FIG. 4L, the mirror 220 is positioned with respect to the electrodes 410a/c and 410b/d to facilitate control of the mirrors through electrical signals present at the electrodes. Thus, it is desirable to align the patterning and etching of the micro-mirrors formed from layer 486 with the electrodes present on the device substrate. In a particular embodiment, the thickness of the silicon layer 486 is reduced to a level at which the silicon layer is semi-transparent in the visible region of the optical spectrum. For example, when the thickness of silicon layer 486 is reduced to about 0.3 μm, the device substrate and electrodes may be imaged through layer 486. Thus, the patterning of layer 486 for the formation of the hinges 224 and the clearance openings 280/282 is performed by imaging alignment marks present on the upper surface of the device substrate 405 or layers coupled to substrate 405.

As illustrated in FIG. 4L, hinge 224 is illustrated by dashed lines. As an example, the hinges illustrated in the figure are torsion spring hinges aligned perpendicular to the edge of the micro-mirror structure 220 that is illustrated in the figure. These hinges provide for movement of the right side of the micro-mirrors toward the device substrate.

FIG. 5 is a simplified top-view illustration of portions of a spatial light modulator according to an embodiment of the present invention. Although FIG. 5 is not drawn to scale, it illustrates the general features of the standoff regions and the mirror layer. As illustrated in the figure, the top portions 472 of the standoff regions form a two-dimensional waffle pack pattern when viewed from the top. Only portions of mirror layer 486 are represented in this illustration for purposes of clarity. Typically, the micro-mirrors associated with this structure would be square micro-mirrors with torsion spring hinges as illustrated. The width of the standoff regions are selected to provide support for the hinge support regions 510 while providing sufficient fill factor for optical applications. As illustrated in FIG. 5, the torsion spring hinges stop at the intersection with the standoff region for purposes of clarity. As will be evident to one of skill in the art, the layer from which the torsion spring hinges and mirror plate are formed is bonded to an upper surface of the standoff region and is present at locations 510 and others. Moreover, the center to center spacing of adjacent sections, the lateral clearance between individual micro-mirrors and the standoff regions, and other geometrical design parameters are selected in accordance with optical and mechanical system objectives.

Figure 6:
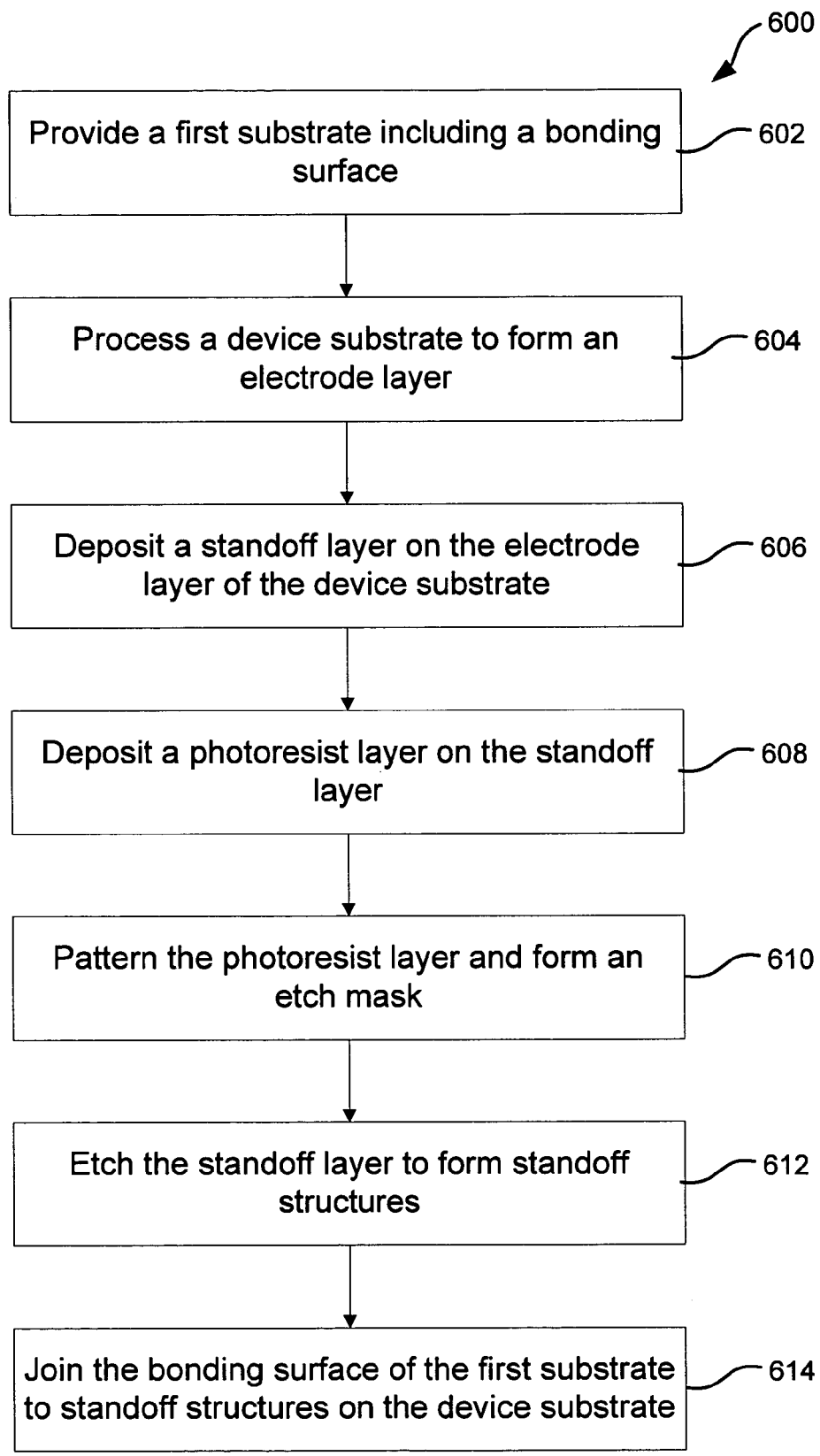
FIG. 6 is simplified flowchart illustrating a method of fabricating an integrated spatial light modulator according to an embodiment of the present invention.

FIG. 6 is simplified flowchart illustrating a method of fabricating an integrated spatial light modulator according to an embodiment of the present invention. The process flow 600 includes providing a first substrate in step 602. In a specific embodiment, the first substrate is a multilayered SOI substrate with single crystal silicon layers surrounding a buried oxide layer. In step 604, a device substrate is processed to form at least an electrode layer. Additional layers are formed in some embodiments of the present invention, with the electrode layer being the last layer defined by the processing steps. The geometry and structure of the electrodes is selected to correlate with mirrors fabricated in at least one layer of the first substrate. In some embodiments, the layers formed on the device substrate include layers defined using standard CMOS processes including interconnect wiring and via formation.

In step 606, a standoff layer is deposited on the electrode layer of the device substrate. In a specific embodiment, the standoff layer is a silicon oxide layer as described above. Other standoff layer materials, including silicon nitride, silicon oxynitride, amorphous silicon, poly-silicon, the like, and combinations of these materials are utilized in alternative embodiments. In embodiments of the present invention, the formation of the standoff layer is performed using low temperature deposition processes, for example, temperatures less than 500° C. In a particular embodiment according to the present invention, the standoff layer is formed using a deposition process performed at a temperature of less than about 400° C. In these embodiments, the deposition and processing of the standoff layer does not adversely impact the circuitry previously fabricated on the device substrate. The thickness of the standoff layer is a predetermined thickness. In one embodiment, the thickness of the standoff layer as deposited is about 1.9 µm. In alternative embodiments the thickness ranges from about 0.5 µm to about 5.0 µm.

In step 608, a photoresist layer is deposited on the standoff layer. The photoresist layer is patterned in step 610 and subsequent processing steps are used to form an etch mask. The formation of an etch mask will be evident to those of skill in the art. In step 612, the etch mask is used to etch selected portions of the standoff layer to form standoff structures. In a particular embodiment, the etch process is terminated when the electrode layer is exposed. In other embodiments, the etch process is terminated prior to exposure of the electrodes present on the device substrate, providing a passivation layer for the electrodes. The lateral shape of the standoff structures is a function of the etch process used in step 612. In one embodiment, an anisotropic etch is used that provides vertical sidewalls. In another embodiment, a combination of an anisotropic (dry) and an isotropic (wet) etch is used to provide vertical sidewalls over a majority of the standoff structure combined with a chemically etched surface when the etching process is terminated.

In step 614 the bonding surface of the first substrate is joined to the standoff structures located on the device substrate. As discussed above, a variety of wafer bonding techniques are employed in embodiments of the present intention. In a particular embodiment, the bonding process is a room temperature covalent bonding process, forming hermetic bonds at the interface between the standoff structures and the bonding surface of the first substrate.

It should be appreciated that the specific steps illustrated in FIG. 6 provide a particular process flow according to one embodiment of the present invention. Other sequence of steps may also be performed according to alternative embodiments. For example, alternative embodiments of the present invention may perform the processing steps outlined above in a different order. For example, the order in which the substrates are processed may be varied, with the device substrate being processed prior to the first substrate. Moreover, the individual steps illustrated in FIG. 6 may include multiple sub-steps that may be performed in various sequences as appropriate to the individual step. For example, in step 604, the devices formed on the device substrate may include multiple device features that may be defined in various sequences within the scope of the present invention. Furthermore, additional processing steps may be added or removed depending on the particular applications. One of ordinary skill in the art would recognize many variations, modifications, and alternatives.

Figure 7:
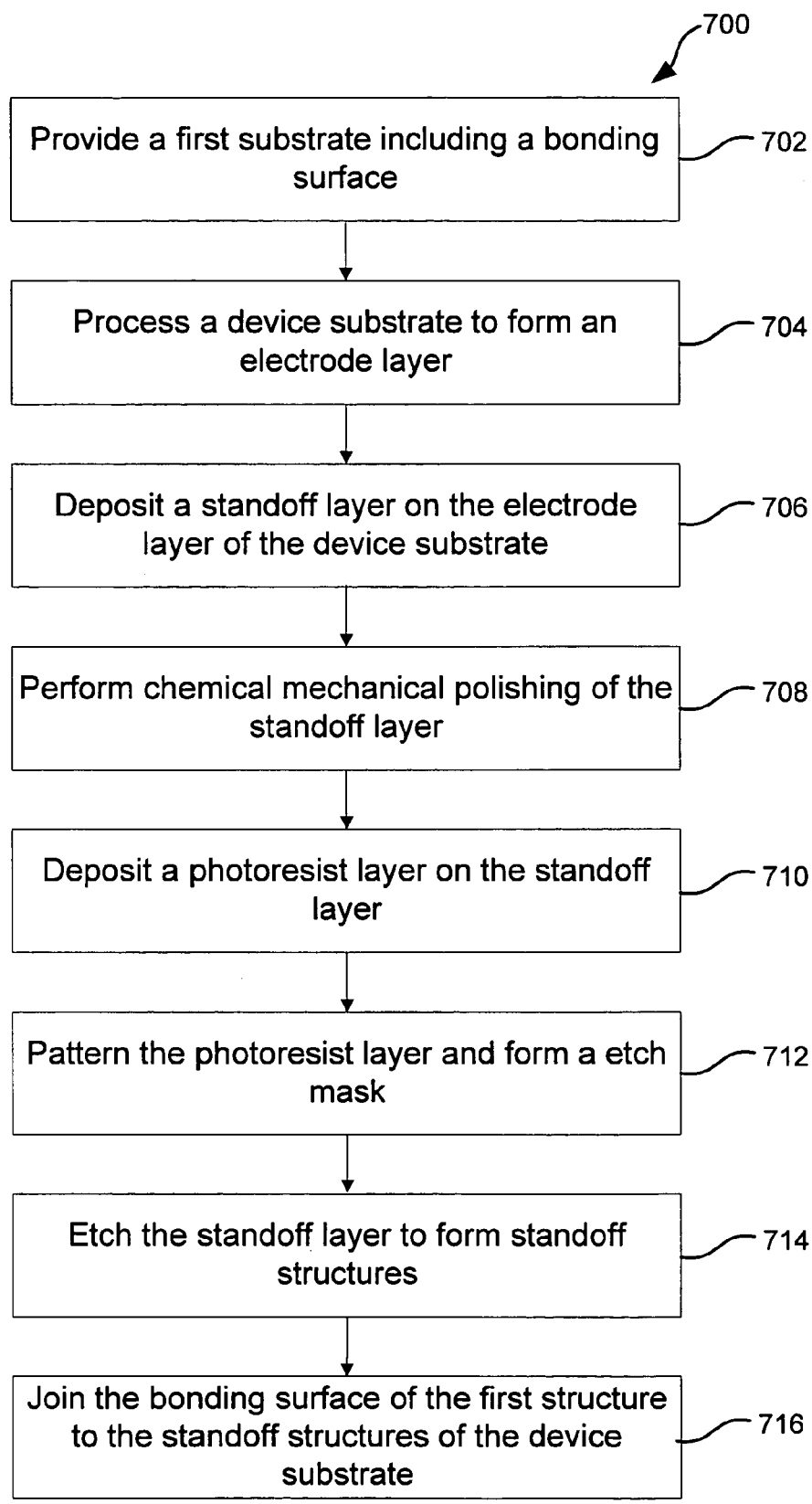
FIG. 7 is a simplified flowchart illustrating a method of fabricating an integrated spatial light modulator according to another embodiment of the present invention.

FIG. 7 is a simplified flowchart illustrating a method of fabricating an integrated spatial light modulator according to another embodiment of the present invention. The process flow 700 includes providing a first substrate in step 702. In a specific embodiment, the first substrate is a multilayered SOI substrate with silicon layers surrounding a buried oxide layer. In some embodiments, the silicon layers are single crystal silicon layers although this is not required by the present invention. In step 704, a device substrate is processed to form at least an electrode layer. Additional layers are formed in some embodiments of the present invention, with the electrode layer being the last layer defined by the processing steps. The geometry and structure of the electrodes is selected to correlate with mirrors fabricated in at least one layer of the first substrate.

In step 706, a standoff layer is deposited on the electrode layer of the device substrate. In a specific embodiment, the standoff layer is a silicon oxide layer as described above, although this is not required by the present invention. Other standoff layer materials, including silicon nitride, amorphous silicon, and poly-silicon are utilized in alternative embodiments. In some embodiments, a combination of these layers is deposited to form a composite multi-layer standoff structure. The thickness of the standoff layer is a predetermined thickness. In the embodiment illustrated by the process flow in FIG. 7, the thickness of the standoff layer is selected to be greater than the eventual height of the standoff structures. In this embodiment, the thickness of the standoff layer is about 3.0 µm.

In step 708, a CMP process is performed to reduce the thickness of the as deposited standoff layer and produce a uniform upper surface for the standoff layer. In one embodiment, the RMS roughness of the upper surface of the standoff layer is about 5 Å after the CMP process is completed. As described above, the CMP process results in extremely smooth bonding surfaces of the standoff structure, enhancing the bond formed in later steps. In a specific embodiment, the CMP process removes an upper portion of the standoff layer, resulting in a standoff layer that is about 1.9 µm in thickness.

In step 710, a photoresist layer is deposited on the standoff layer. The photoresist layer is patterned in step 712 and subsequent processing steps are used to form an etch mask. The formation of an etch mask will be evident to those of skill in the art. In step 714, the etch mask is used to etch the standoff layer to form standoff structures. The etch mask protects the polished surfaces of the standoff structures during the etch process. In a particular embodiment, the etch process is terminated when the electrode layer is exposed. In other embodiments, the etch process is terminated prior to exposure of the electrodes present on the device substrate, providing a passivation layer for the electrodes. The lateral shape of the standoff structures is a function of the etch process used in step 714. In one embodiment, an anisotropic etch is used that provides vertical sidewalls. In another embodiment, a combination of an anisotropic (dry) and an isotropic (wet) etch is used to provide vertical sidewalls over a majority of the standoff structure combined with a chemically etched surface when the etching process is terminated.

In step 716 the bonding surface of the first substrate is joined to the standoff structures located on the device substrate. As discussed above, a variety of wafer bonding techniques are employed, including room temperature covalent bonding, in embodiments of the present intention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A spatial light modulator comprising:
    a first substrate, the first substrate comprising a plurality of electrodes adapted to receive control signals;
    a bias grid coupled to the first substrate and electrically isolated from the plurality of electrodes;
    a standoff structure coupled to the first substrate;
    a mirror plate bonded to the standoff structure, electrically coupled to the bias grid, and adapted to rotate from a first orientation to a second orientation in response to the control signals received by the plurality of electrodes;
    a landing post support structure coupled to the first substrate and electrically coupled to the bias grid; and
    a landing post coupled to the landing post support structure, electrically coupled to the bias grid, and adapted to make contact with the mirror plate positioned at the first orientation.

2. The spatial light modulator of claim 1 wherein the standoff structure is fabricated from a layer deposited at a temperature of less than 400° C.

3. The spatial light modulator of claim 2 wherein the layer is selected from the group consisting of silicon oxide, silicon nitride, and silicon oxynitride.

4. The spatial light modulator of claim 2 wherein the layer is polished using a chemical mechanical polishing process after deposition.

5. The spatial light modulator of claim 1 wherein the landing post is fabricated from tungsten.

6. The spatial light modulator of claim 1 wherein the landing post is fabricated using a premetal contact hole or inter-metal dielectric via plug process.

7. The spatial light modulator of claim 1 wherein the mirror layer comprises a torsion spring hinge.

8. An array of integrated spatial light modulators comprising:
    an electrode layer coupled to a device substrate, the electrode layer including a plurality of electrodes and at least one alignment mark;
    a bias grid layer coupled to the device substrate and electrically isolated from the electrode layer;
    a plurality of landing posts coupled to the device substrate and electrically coupled to the bias grid layer;
    a three-dimensional standoff structure, the standoff structures having side regions defined in a plane perpendicular to the device substrate, a bottom region coupled to the device substrate, and a top region opposite the bottom region; and
    a silicon layer coupled to the top region of the standoff structure, the silicon layer comprising:
        a hinge support region coupled to the top region of the standoff structure;
        a plurality of hinges coupled to the hinge support region; and
        a plurality of moveable members aligned with respect to the at least one alignment mark by imaging the at least one alignment mark through the silicon layer.

9. The array of integrated spatial light modulators of claim 8 wherein the standoff structure is fabricated from a layer deposited at a temperature of less than 400° C., the layer being selected from the group consisting of silicon oxide, silicon nitride, and silicon oxynitride.

10. The array of integrated spatial light modulators of claim 9 wherein the layer is polished using a chemical mechanical polishing process after deposition.

11. The array of integrated spatial light modulators of claim 8 wherein the landing posts are fabricated from tungsten.

12. The array of integrated spatial light modulators of claim 8 wherein the landing posts are fabricated using a premetal contact hole or inter-metal dielectric via plug process.

13. The array of integrated spatial light modulators of claim 8 wherein the silicon layer is semi-transparent during at least one stage of processing.

* * * * *